(12) United States Patent
Sandhu et al.

(10) Patent No.: US 10,763,155 B2
(45) Date of Patent: Sep. 1, 2020

(54) SEMICONDUCTOR CONSTRUCTIONS COMPRISING DIELECTRIC MATERIAL, AND METHODS OF FORMING DIELECTRIC FILL WITHIN OPENINGS EXTENDING INTO SEMICONDUCTOR CONSTRUCTIONS

(71) Applicant: Micron Technology, Inc., Boise, ID (US)

(72) Inventors: Gurtej S. Sandhu, Boise, ID (US); Scott L. Light, Boise, ID (US); John A. Smythe, Boise, ID (US); Sony Varghese, Manchester-by-the-Sea, MA (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 16/179,415

(22) Filed: Nov. 2, 2018

(65) Prior Publication Data

US 2019/0067084 A1 Feb. 28, 2019

Related U.S. Application Data

(62) Division of application No. 15/598,795, filed on May 18, 2017, now Pat. No. 10,153,195.

(51) Int. Cl.
*H01L 21/70* (2006.01)
*H01L 21/762* (2006.01)
(Continued)

(52) U.S. Cl.
CPC ...... *H01L 21/76224* (2013.01); *G03F 7/0233* (2013.01); *G03F 7/038* (2013.01);
(Continued)

(58) Field of Classification Search
CPC ......... H01L 21/76224; H01L 21/02118; H01L 21/02164; H01L 21/0217; H01L 21/02178;
(Continued)

(56) References Cited

U.S. PATENT DOCUMENTS 7,622,369 B1 11/2009 Lee
2008/0166888 A1 7/2008 Hsu
(Continued)

*Primary Examiner* — Victor A Mandala
*Assistant Examiner* — Colleen E Snow
(74) *Attorney, Agent, or Firm* — Wells St. John P.S.

(57) ABSTRACT

Some embodiments include a semiconductor construction which has one or more openings extending into a substrate. The openings are at least partially filled with dielectric material comprising silicon, oxygen and carbon. The carbon is present to a concentration within a range of from about 3 atomic percent to about 20 atomic percent. Some embodiments include a method of providing dielectric fill across a semiconductor construction having an opening extending therein. The semiconductor construction has an upper surface proximate the opening. The method includes forming photopatternable dielectric material within the opening and across the upper surface, and exposing the photopatternable dielectric material to patterned actinic radiation. Subsequently, the photopatternable dielectric material is developed to pattern the photopatternable dielectric material into a first dielectric structure which at least partially fills the opening, and to remove the photopatternable dielectric material from over the upper surface.

18 Claims, 21 Drawing Sheets

(51) Int. Cl.
  H01L 21/02      (2006.01)
  H01L 21/3105    (2006.01)
  H01L 29/06      (2006.01)
  G03F 7/075      (2006.01)
  G03F 7/038      (2006.01)
  G03F 7/039      (2006.01)
  G03F 7/20       (2006.01)
  G03F 7/30       (2006.01)
  G03F 7/023      (2006.01)
  H01L 21/311     (2006.01)

(52) U.S. Cl.
  CPC ............ *G03F 7/039* (2013.01); *G03F 7/0757* (2013.01); *G03F 7/20* (2013.01); *G03F 7/30* (2013.01); *H01L 21/0217* (2013.01); *H01L 21/02118* (2013.01); *H01L 21/02164* (2013.01); *H01L 21/02178* (2013.01); *H01L 21/02181* (2013.01); *H01L 21/02183* (2013.01); *H01L 21/02189* (2013.01); *H01L 21/02345* (2013.01); *H01L 21/311* (2013.01); *H01L 21/31053* (2013.01); *H01L 21/31058* (2013.01); *H01L 21/76229* (2013.01); *H01L 29/0649* (2013.01)

(58) Field of Classification Search
  CPC ......... H01L 21/02181; H01L 21/02183; H01L 21/02189; H01L 21/02345; H01L 21/31053; H01L 21/31058; H01L 21/311; H01L 21/76229; H01L 29/0649; G03F 7/0233; G03F 7/038; G03F 7/039; G03F 7/0757; G03F 7/20; G03F 7/30
  See application file for complete search history.

(56) References Cited

U.S. PATENT DOCUMENTS

2014/0054699 A1*  2/2014  Liu ................. H01L 21/76232
                                                  257/347
2014/0272196 A1   9/2014  Bass

* cited by examiner

SEMICONDUCTOR CONSTRUCTIONS COMPRISING DIELECTRIC MATERIAL, AND METHODS OF FORMING DIELECTRIC FILL WITHIN OPENINGS EXTENDING INTO SEMICONDUCTOR CONSTRUCTIONS

RELATED PATENT DATA

This patent resulted from a divisional of U.S. patent application Ser. No. 15/598,795, which was filed May 18, 2017, and which is hereby incorporated herein by reference.

TECHNICAL FIELD

Semiconductor constructions comprising dielectric material, and methods of forming dielectric fill within openings extending into semiconductor constructions.

BACKGROUND

The fabrication of structures associated with semiconductor substrates (e.g., fabrication of integrated circuitry, fabrication of micro-electro-mechanical systems, etc.) may include process stages in which numerous openings of different sizes and depths are to be filled with dielectric material. Subsequently, planarization (e.g., chemical-mechanical polishing) may be utilized to attempt to form a planar surface which extends across the dielectric material within the openings, and across regions of the semiconductor substrate between the openings. However, difficulties are encountered with conventional processes, as described with reference to FIGS. 1-3.

FIG. 1 shows a construction 10 which includes a semiconductor substrate 12. The semiconductor substrate 12 includes semiconductor material; and may, for example, comprise, consist essentially of, or consist of monocrystalline silicon. The term "semiconductor substrate" (or alternatively, "semiconductor construction") means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the semiconductor substrate 12 may contain one or more materials associated with integrated circuit fabrication, and/or one or more materials associated with the fabrication of micro-electro-mechanical systems (MEMS). Such materials may include, for example, one or more of refractory metal materials, barrier materials, diffusion materials, insulator materials, etc.

Openings 14, 16 and 18 are shown extending into the semiconductor substrate 12, with the openings having different sizes relative to one another. In some applications, the substrate 12 and be considered to have an upper surface 19, and the openings 14, 16 and 18 may be considered to extend through such upper surface and into the underlying substrate. In some applications, the upper surface 19 may be a substantially planar upper surface; with the term "substantially planar" meaning planar to within reasonable tolerances of fabrication and measurement.

Although the substrate 12 is illustrated to be homogeneous, in some embodiments the substrate may comprise multiple materials, structures, components, etc. associated with integrated circuit fabrication and/or MEMS fabrication. For instance, in some embodiments the substrate 12 may include a semiconductor material wafer (for instance, a monocrystalline silicon wafer) supporting wordlines, bitlines and memory cells of a memory array (for instance, a three-dimensional NAND memory array), and supporting circuitry peripheral to the memory array.

The openings 14, 16 and 18 may be representative of a large number of openings which extend into the substrate 12 after fabrication of components associated with integrated circuitry and/or MEMS.

The opening 14 may be along the edge of a wafer and may correspond to, for example, an alignment mark utilized for aligning the wafer during masking and/or other process stages.

The opening 16 may correspond to, for example, an opening extending to a staircase region adjacent integrated memory. For instance, the integrated memory may correspond to three-dimensional NAND and/or other three-dimensional memory, and the staircase region may be a region where contacts are formed to bitlines and/or wordlines associated with the three-dimensional memory. The bottom of opening 16 is shown to comprise tiers (i.e., steps), and accordingly opening 16 is an example of an opening having a non-planar bottom surface. In contrast, openings 14 and 18 are examples of openings having planar bottom surfaces. In some aspects, the steps at the bottom of opening 16 may be considered to be representative of stair-step type structures.

The opening 18 may correspond to, for example, of an opening remaining within a memory array region, or other region, during fabrication of integrated circuitry and/or MEMS.

Openings may have shapes other than those shown for openings 14, 16 and 18; and may, for example, have tapered conical shapes, non-straight sidewalls, etc.

Referring to FIG. 2, dielectric material 20 is formed across the upper surface 19 and within the openings 14, 16 and 18. The dielectric material 20 may be spin-on dielectric, and in some applications may comprise silicon oxide.

Ultimately, excess dielectric material 20 is to be removed to leave a planar surface (as described below with reference to FIG. 3). The excess dielectric material 20 may be referred to as overburden. The variation in sizes amongst the openings 14, 16 and 18 leads to a substantial variation in the thickness of the overburden of dielectric material 20. Specifically, the overburden across opening 16 is less than the overburden across upper surface 19, or the overburden across openings 14 and 18.

Referring to FIG. 3, construction 10 is shown after planarization (for instance, chemical-mechanical polishing) to remove the overburden of dielectric material 20. Ideally, such forms a planarized surface 21. However, the substantial overburden and non-uniformity of the thickness of the overburden (shown in FIG. 2) may lead to difficulties during the planarization process; and may result in dishing and/or other structural defects rather than the desired planar surface 21. For instance, a concave (or dished) surface 21a (shown with a dashed line) may result rather than the desired planar surface 21.

Another problem that may occur relative to the prior art processing of FIGS. 2 and 3 is that the large amount of dielectric material 20 within opening 16 may experience substantial shrinkage and/or other strain-inducing characteristics during subsequent thermal treatments, which may lead to cracks forming in the material 20 and/or in regions adjacent to the material 20.

It is desired to develop improved fabrication methods which alleviate the problems described above with reference to FIGS. 2 and 3.

DETAILED DESCRIPTION OF THE ILLUSTRATED EMBODIMENTS

Some embodiments include utilization of photopatternable dielectric material to at least partially fill one or more openings associated with a semiconductor substrate (i.e., semiconductor construction). For instance, the photopatternable dielectric material may be utilized to form dielectric structures which partially fill the openings. The dielectric structures may reduce volume discrepancies amongst the openings. Spin-on dielectric may then be applied across the openings, with the spin-on dielectric leaving some overburden. However, the amount of overburden, as well as the thickness variation throughout the overburden, may be reduced relative to conventional methods due to the reduction in volume discrepancies amongst the openings. As another example, in some embodiments the photopatternable dielectric material may be utilized to form dielectric structures which substantially fill the openings, and may thereby eliminate utilization of the spin-on dielectric of conventional processing. Example embodiments are described with reference to FIGS. 4-21.

Figure 1:
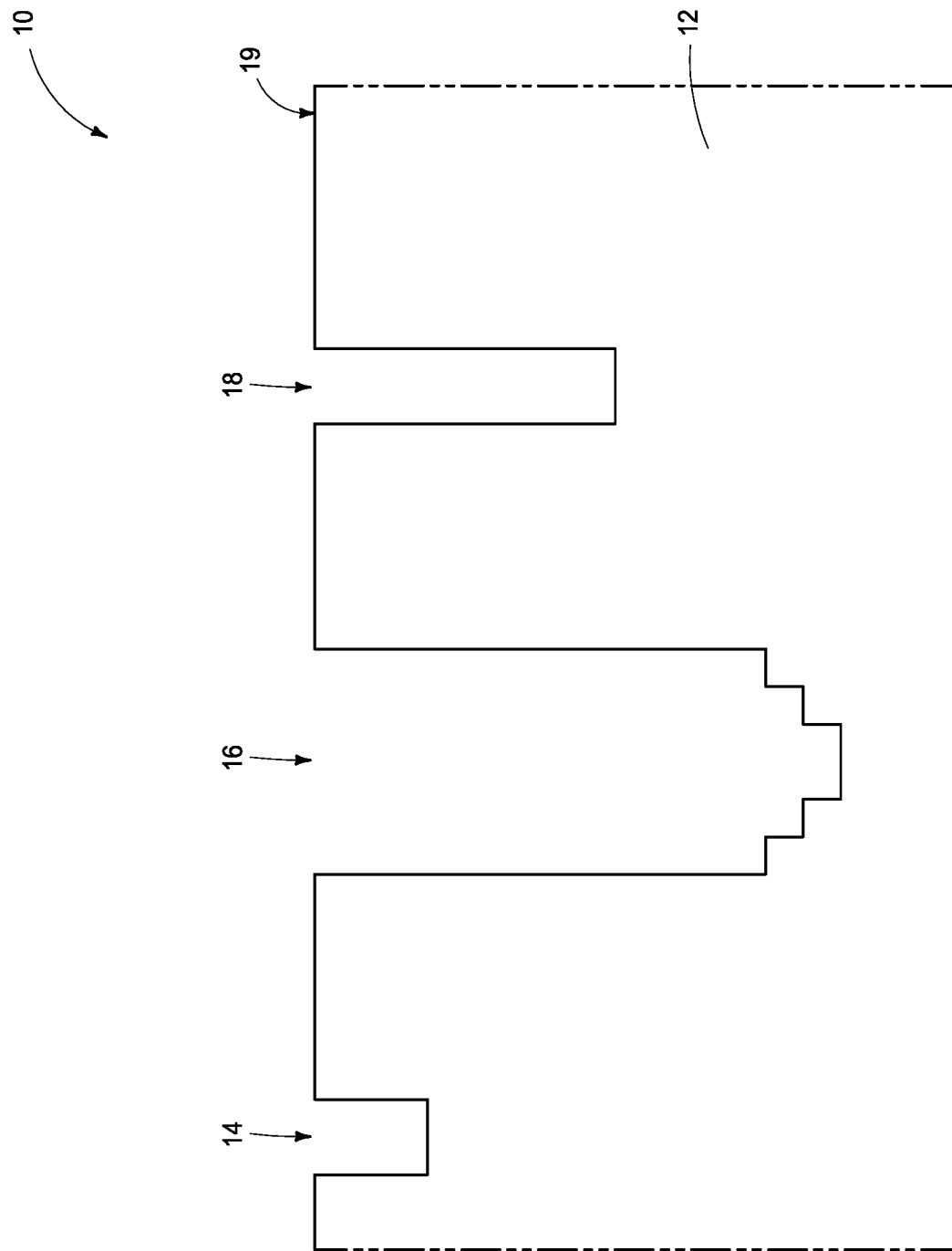
FIGS. 1-3 are diagrammatic cross-sectional views of an example semiconductor construction shown at process stages of a prior art process sequence.
Figure 2:
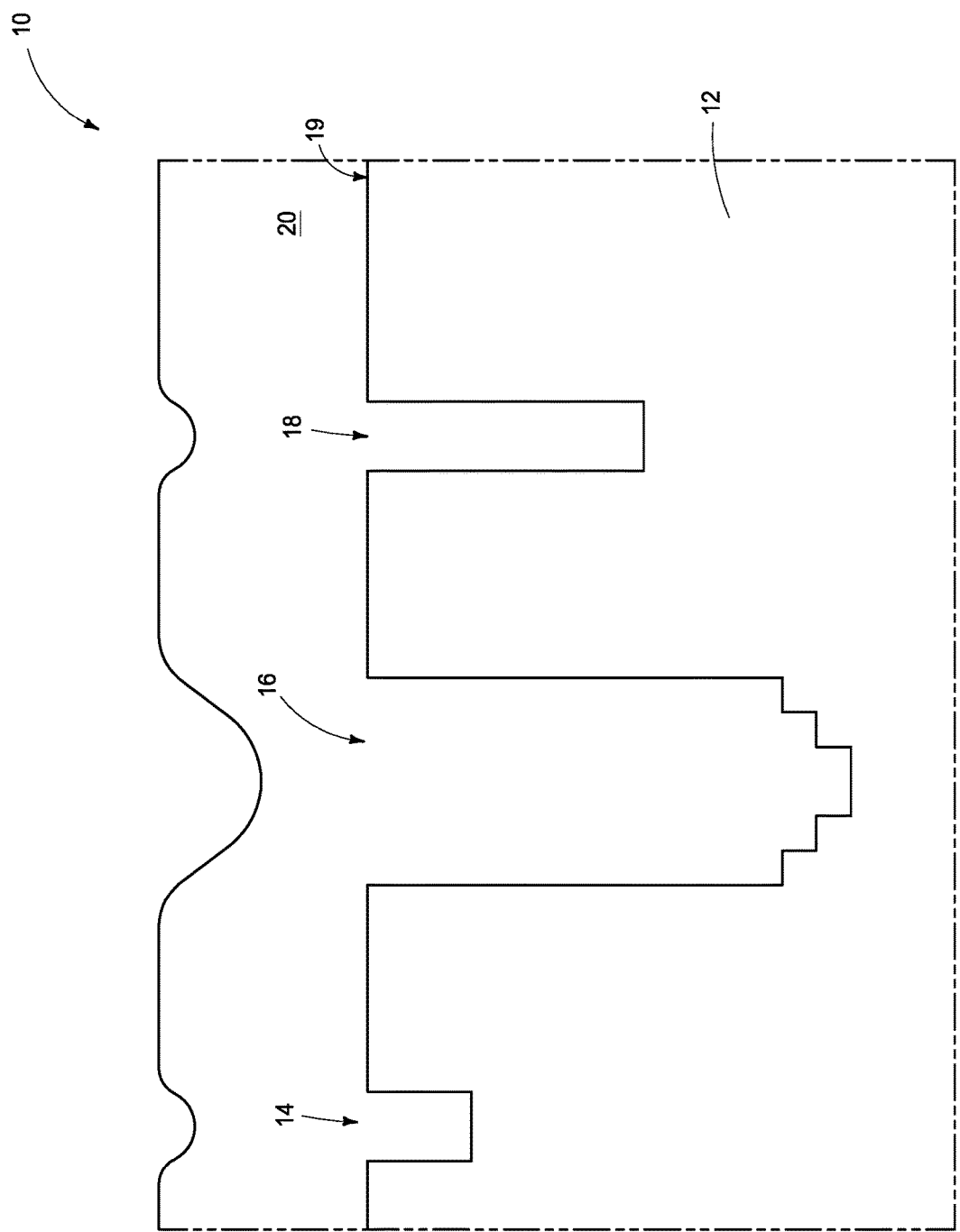
Figure 3:
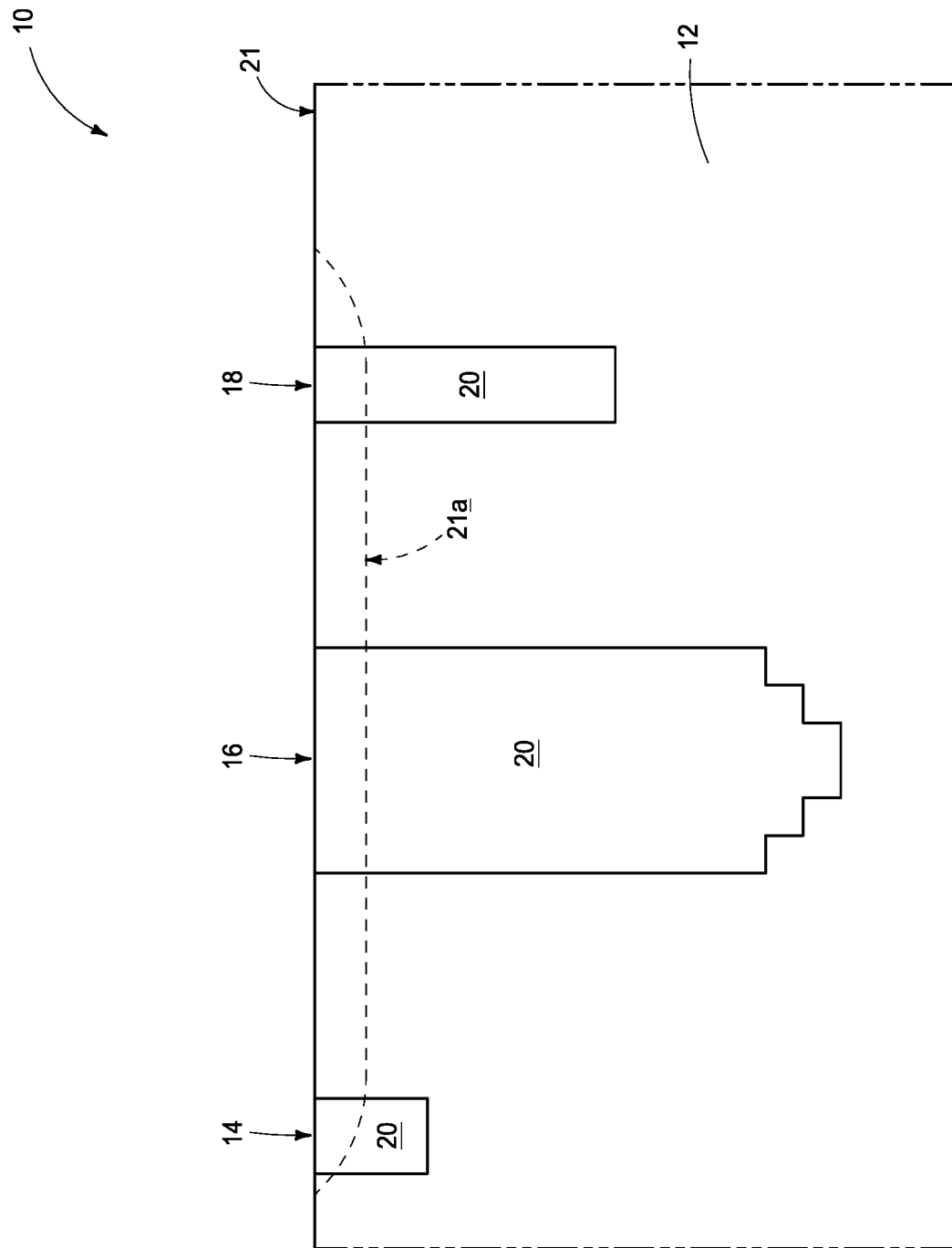
Figure 4:
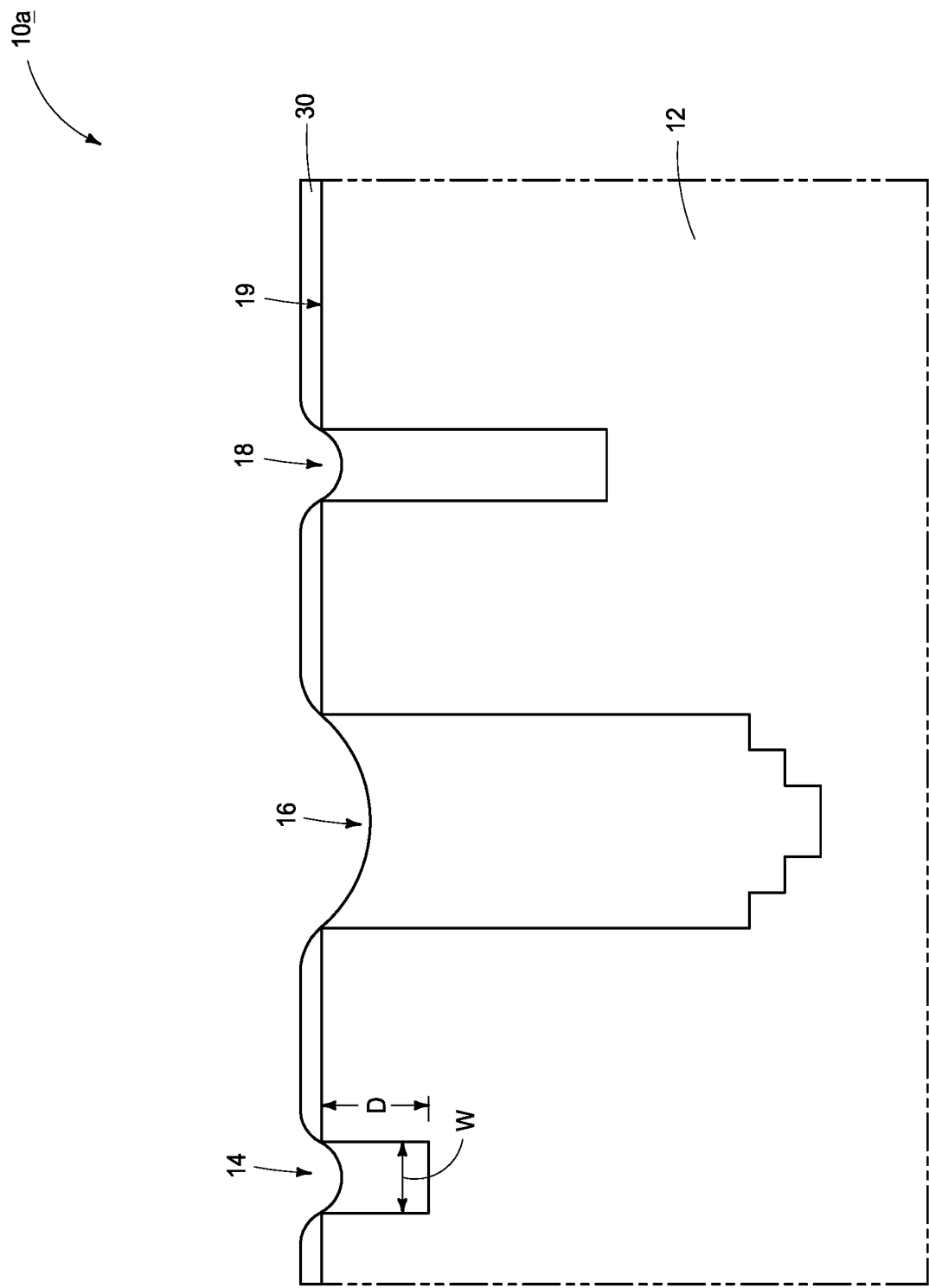
FIGS. 4-8 are diagrammatic cross-sectional views of the example semiconductor construction of FIG. 1 shown at process stages of an example embodiment sequence.

Referring to FIG. 4, a construction 10a is shown comprising the substrate 12 described above with reference to FIG. 1. Such substrate has the upper surface 19, and the openings 14, 16 and 18 extending through such upper surface.

The openings 14, 16 and 18 may have any suitable dimensions. In some embodiments, one or more of the openings may have a width, W, within a range of from about 2 micrometers (μm) to about 50 μm, from about 2 micrometers (μm) to about 20 μm, from about 2 μm to about 10 μm, etc.; and in some embodiments, one or more of the openings may have a depth, D, within a range of from about 2 μm to about 20 μm, from about 5 μm to about 10 μm, etc.

Photopatternable dielectric material 30 is formed across the upper surface 19 and within the openings 14, 16 and 18. The photopatternable dielectric material 30 may comprise any suitable composition or combination of compositions; and in some embodiments may include one or more of siloxane, silsesquioxane and diazonapthoquinone. The term "siloxane" is utilized herein to be generic to a class of polymers having siloxane bonds and side groups (for instance, H and/or organic side groups, such as methyl, phenyl, vinyl, etc.). The term "silsesquioxane" is utilized herein to be generic to a class of polymers having monomers with the chemical formula $RSiO_{3/2}$; where R is hydrogen and/or organic groups. The term "diazonapthoquinone" is utilized herein to be generic to diazonapthoquinone itself, and to diazonapthoquinone derivatives.

The photopatternable dielectric material 30 may be in any suitable form; and may be, for example, in the form of liquid or powder.

The photopatternable dielectric material 30 may be spread across the upper surface 19 and within the openings 14, 16 and 18 utilizing any suitable methodology; including, for example, spin-on methodology, chemical vapor deposition (CVD), atomic layer deposition (ALD), powder-dispersion methodology, etc.

Figure 5:
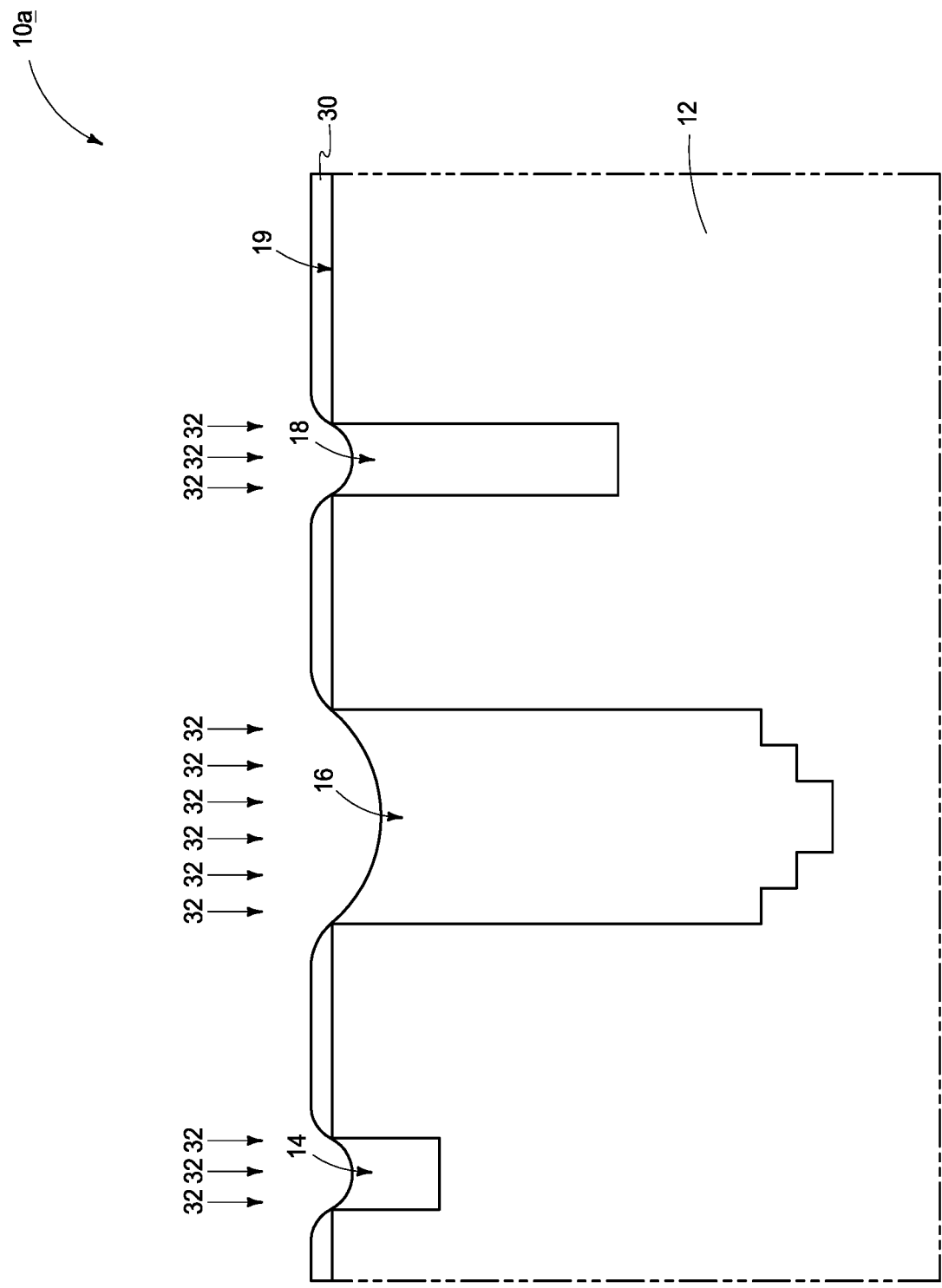

Referring to FIG. 5, the photopatternable dielectric material 30 is exposed to patterned actinic radiation 32. In some embodiments, the photopatternable dielectric material may be subjected to a pre-exposure bake prior to the exposure to the patterned actinic radiation. The actinic radiation 32 may comprise any suitable radiation; such as, for example, electromagnetic radiation of suitable wavelength. The actinic radiation may be patterned utilizing a reticle (not shown). The reticle may have any suitable configuration; and may comprise, for example, one or more grating patterns, one or more patterns of opaque and transparent regions, one or more half-tone regions, etc. The exposure to the actinic radiation may be a single exposure, or may be multiple exposures. If multiple exposures are utilized, such may be conducted with more than one reticle.

The reticle pattern utilized for patterning the actinic radiation may be generated with any suitable methodology, and in some applications may utilize one or more datasets that had been used for fabricating circuitry and/or other structures within substrate 12.

The patterned actinic radiation 32 may induce polymerization within regions of the photopatternable dielectric material 30 exposed to the actinic radiation in applications in which photopatternable dielectric material 30 is a negative tone material; or may induce depolymerization in regions of photopatternable dielectric material 30 in applications in which the photopatternable dielectric material 30 is a positive tone material. In the illustrated embodiment, the patterned actinic radiation 32 is directed toward regions of photopatternable dielectric material 30 which are to remain after the exposure to the actinic radiation and subsequent development. The photopatternable dielectric material 30 is thus a negative tone material. In other embodiments, the photopatternable dielectric material 30 may be a positive tone material; and accordingly, the actinic radiation 32 may be directed toward regions of the photopatternable dielectric material 30 which are to be removed after the exposure to the actinic radiation and subsequent development.

Figure 6:
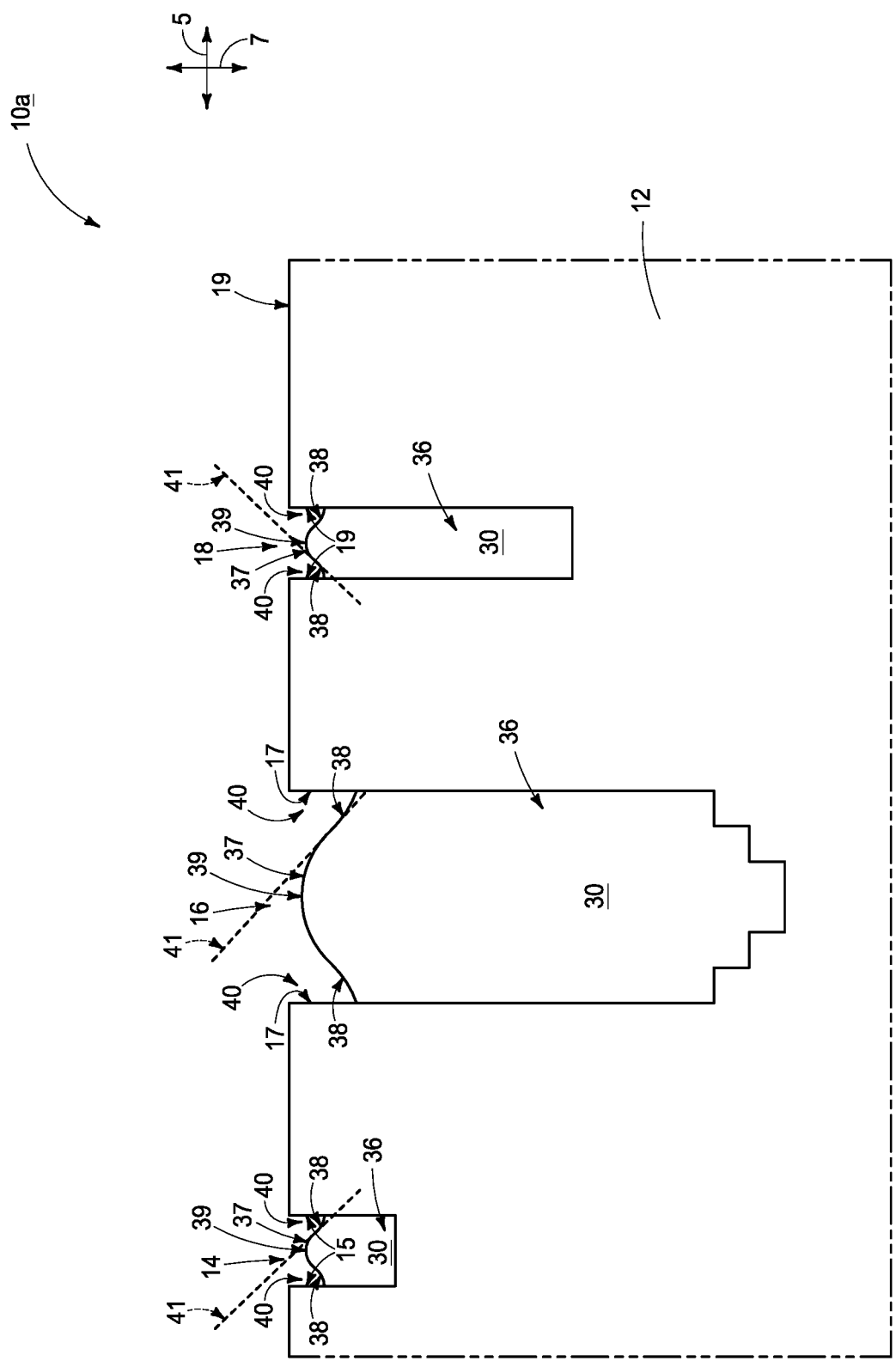

Referring to FIG. 6, the photopatternable material 30 is developed after the exposure to the actinic radiation 32 (FIG. 5). The development removes excess material 30, and leaves the remaining material 30 as dielectric structures 36 within the openings 14, 16 and 18. The development of the photopatternable material 30 may comprise utilization of appropriate solvents and/or appropriate rinsing to leave polymerized regions of photopatternable material 30 within openings 14, 16 and 18, while removing other regions of the photopatternable material 30 (i.e., while removing the photopatternable material 30 from over the upper surfaces 19 of semiconductor substrate 12). In some embodiments, the development may comprise a rinse with deionized water.

The dielectric structures 36 are shown to only partially fill the openings 14, 16 and 18 in the embodiment of FIG. 6. In other embodiments (discussed below with reference to FIG. 19) the dielectric structure 36 may entirely fill the openings 14, 16 and 18. Also, although the dielectric structures 36 are shown partially filling all of the openings 14, 16 and 18; in other embodiments, the dielectric structures may fully fill one or more of the openings, and partially fill one or more of the other openings. In embodiments in which the dielectric structures 36 only partially fill one or more of the openings, the dielectric structures may fill any suitable portions of such openings, by volume. For instance, in some embodiments the dielectric structures 36 may fill at least 20 volume % of one or more of the openings 14, 16 and 18; may fill at least 40 volume % of one or more such openings; may fill at least 80 volume % of one or more of such openings; etc.

The dielectric structures 36 may comprise carbon, silicon and oxygen from the precursor materials (e.g., siloxane, silsesquioxane and diazonapthoquinone). In some embodiments, the carbon may be present to a concentration within a range of from about 3 atomic percent to about 20 atomic percent; a range of from about 3 atomic percent to about 10 atomic percent; a range of from about 10 atomic percent to about 20 atomic percent; etc. In some embodiments, the dielectric structures 36 may comprise one or both of hydrogen and nitrogen in addition to the carbon, silicon and oxygen. In some embodiments, the dielectric structures 36 may be considered to comprise silicon dioxide having one or more of carbon, nitrogen and hydrogen dispersed therein.

The dielectric structures 36 have upper surfaces 37. The shapes of such upper surfaces may be tailored by tailoring the reticle utilized at the processing stage of FIG. 5. Such reticle may have, for example, partially-transmissive regions, opaque regions, and fully transmissive regions. For instance, in the embodiment of FIG. 6 the dielectric structures 36 are shown to have peaks 39, and sidewalls 38 extending downwardly from such peaks. The openings 14, 16 and 18 have peripheral edges 15, 17 and 19, respectively; and the sidewalls 38 of dielectric structures 36 are spaced from such peripheral surfaces by gaps 40. In some embodiments, the shapes of the upper surfaces 37 of the dielectric structures 36 may be useful in obtaining a robust interface with a second dielectric material (discussed below with reference to FIG. 7) provided within the openings 14, 16 and 18 in regions remaining above the dielectric structures 36.

In some embodiments, the substantially planar upper surface 19 may be considered to extend along a horizontal direction 5, and a vertical direction 7 may be defined to extend orthogonally relative to such horizontal direction. The sidewalls 38 extend along directions 41, and such directions 41 may be angled from the vertical direction 7 by any suitable amount. For instance, in some embodiments the directions 41 may be angled from the vertical direction 7 by at least about 10 degrees, at least about 20 degrees, at least about 30 degrees, at least about 45 degrees, etc. In some embodiments, it may be desired to avoid sharp corners along the upper surfaces 37 of the dielectric structures; as it is found that when fractures occur in dielectric materials, such fractures frequently propagate from sharply angled features.

In some embodiments, the dielectric structures 36 may be treated to alter one or more physical characteristics of the dielectric structures. For instance, such treatment may increase density of silicon dioxide within the dielectric structures 36. As another example, the treatment may alter the shape, roughness, chemical characteristics, etc. of upper surfaces 37 of the dielectric structures 36 to improve adhesion to another dielectric material provided over the dielectric structures 36 (with an example of such other dielectric material being shown in FIG. 7). The treatment of the dielectric structures 36 may include exposure to one or more of ultraviolet light, hydrogen peroxide, water vapor, steam, ammonia, oxygen, ozone, ozonated water, tetramethylammonium hydroxide, nitrogen, argon, etc.; and/or thermal processing to a temperature within a range of from about 250° C. to about 850° C. For instance, in some embodiments the treatment of the dielectric structures 36 may comprise thermal processing to the temperature within the range of from about 250° C. to about 850° C., while the upper surfaces 37 of the dielectric structures are exposed to only a nonreactive ambient (e.g., one or both of nitrogen and argon). In other embodiments, the treatment of the dielectric structures 36 may comprise thermal processing to the temperature within the range of from about 250° C. to about 850° C., while the upper surfaces 37 of the dielectric structures are exposed to a reactive ambient (e.g., one or more of ammonia, tetramethylammonium hydroxide, ozone, hydrogen peroxide, etc.); with the term "reactive ambient" meaning an ambient that may react with the composition of the upper surfaces 37.

Figure 7:
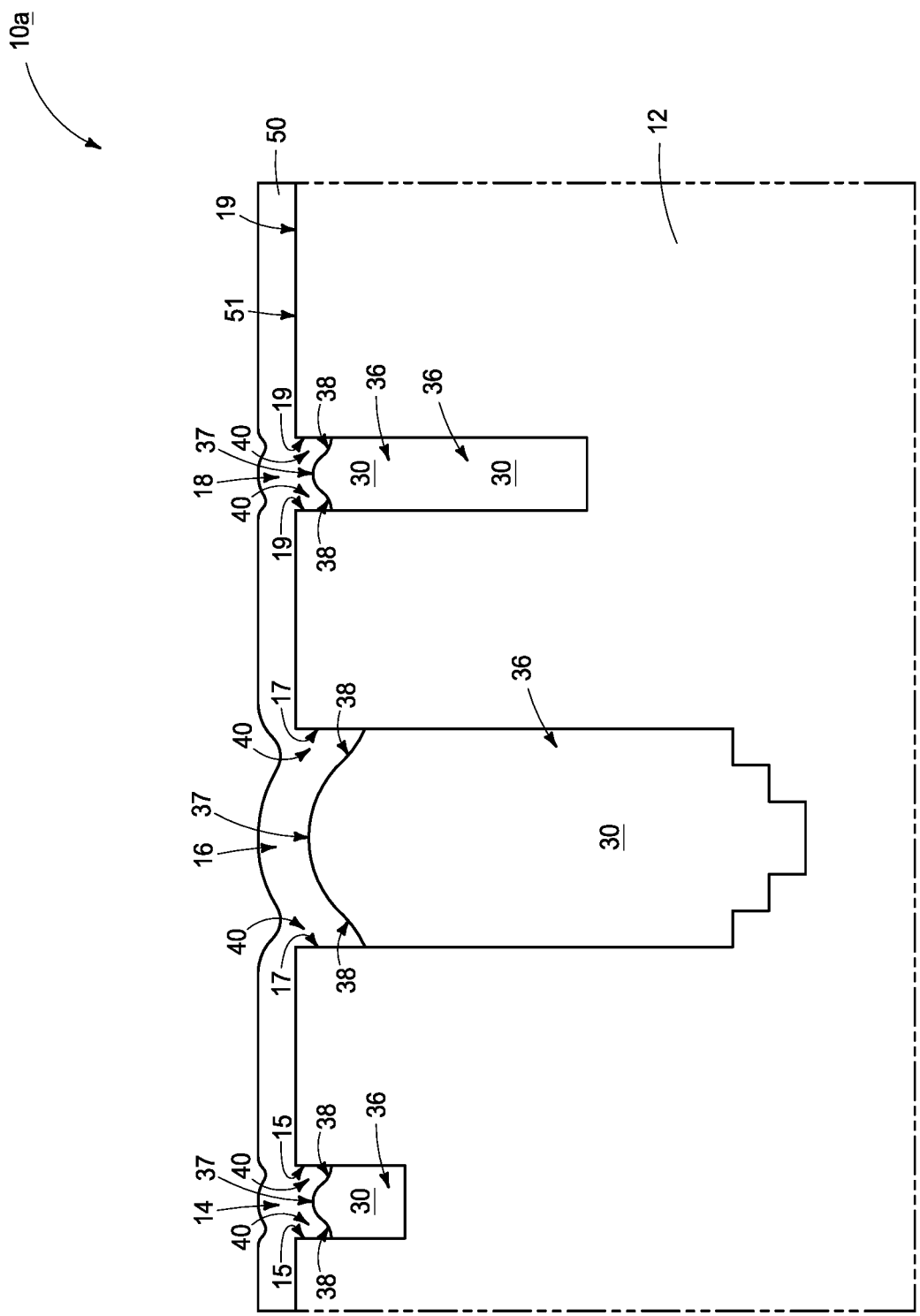

Referring to FIG. 7, dielectric material 50 is formed across the upper surface 19 of semiconductor substrate 12, and across the upper surfaces 37 of dielectric structures 36 within openings 14, 16 and 18. The dielectric material 50 may comprise any suitable composition or combination of compositions. In some embodiments, the dielectric structures 36 may be considered to comprise a first composition, and the dielectric material 50 may be considered to comprise a second composition which is different from the first composition. In some embodiments, the composition of dielectric material 50 may include one or more of aluminum oxide, hafnium oxide, zirconium oxide, silicon dioxide, silicon nitride, tantalum oxide, titanium oxide, etc. In some embodiments, the dielectric material 50 may correspond to spin-on material; and may comprise, consist essentially of, or consist of silicon dioxide.

In the shown embodiment, the dielectric material 50 is directly against the upper surfaces 37 of dielectric structures 36, and extends within the gaps 40 between the sidewall edges 38 of the dielectric structures 36 and the peripheral edges 15, 17 and 19 of the openings 14, 16 and 18, respectively. The extension of the dielectric material 50 into the gaps 40 may assist in retaining the dielectric material 50 within the openings 14, 16 and 18 as compared to embodiments in which there are no gaps 40, and instead the upper surfaces 37 of the dielectric structures 36 are planar. If the dielectric material 50 is a spin-on material, there may be a subsequent step (for instance, baking or other suitable thermal processing) utilized to harden the dielectric material 50.

In some embodiments, the dielectric structures 36 may be referred to as first, dielectric structures, and the dielectric material 50 may be referred to as a second dielectric structure (or as an additional dielectric structure) provided over the first dielectric structures 36 to substantially entirely fill the openings 14, 16 and 18. Although the openings 14, 16 and 18 are shown to be entirely filled utilizing only the dielectric material 50 of FIG. 7, in other embodiments two or more dielectric materials may be utilized to fill the remaining portions of the openings 14, 16 and 18 over the dielectric structures 36. Generally, the processing of FIG. 7 may be considered an example of a process in which regions of the openings 14, 16 and 18 over the first dielectric structures 36 are substantially entirely filled utilizing one or more additional dielectric structures formed over the first dielectric structures 36.

Figure 8:
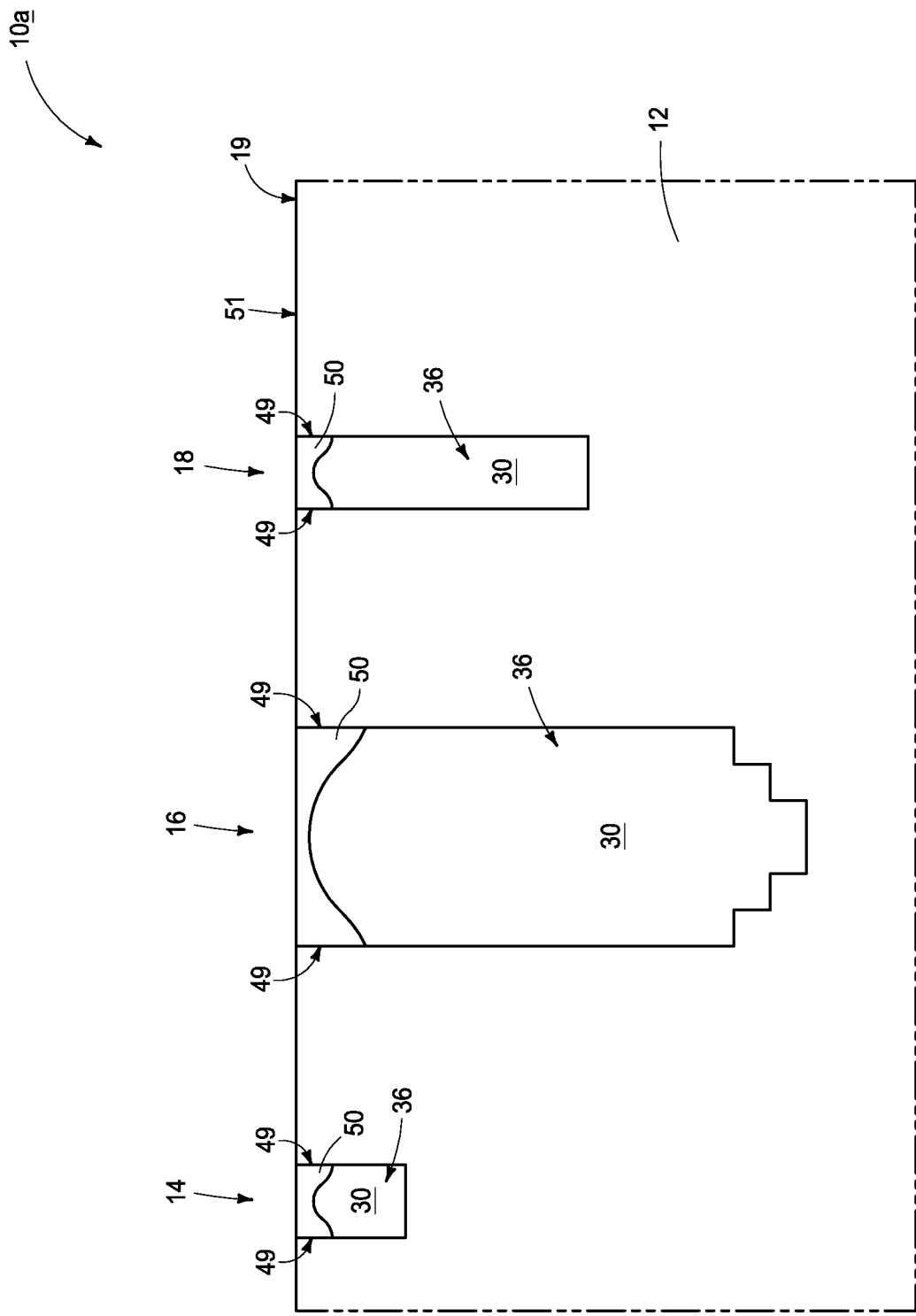

Referring to FIG. 8, construction 10a is subjected to chemical-mechanical polishing (CMP) or other suitable processing to remove excess dielectric material 50 from over the upper surface 19 of the semiconductor substrate 12. In the shown embodiment, the processing forms a planarized surface 51 extending across the dielectric material 50 within openings 14, 16 and 18, and across regions of the substrate 12 between the openings 14, 16 and 18. The planarized surface 51 may be planar, or at least substantially planar, in some embodiments.

The planarization may stop at the upper surface 19 of substrate 12, as shown in FIG. 8; or in other embodiments, may remove a portion of substrate 12. For instance, FIG. 9 shows an embodiment in which CMP has been utilized to remove some of the substrate 12 and form a planarized upper surface 51 that includes portions of substrate 12, portions of dielectric material 36, and portions of dielectric material 50.

Figure 9:
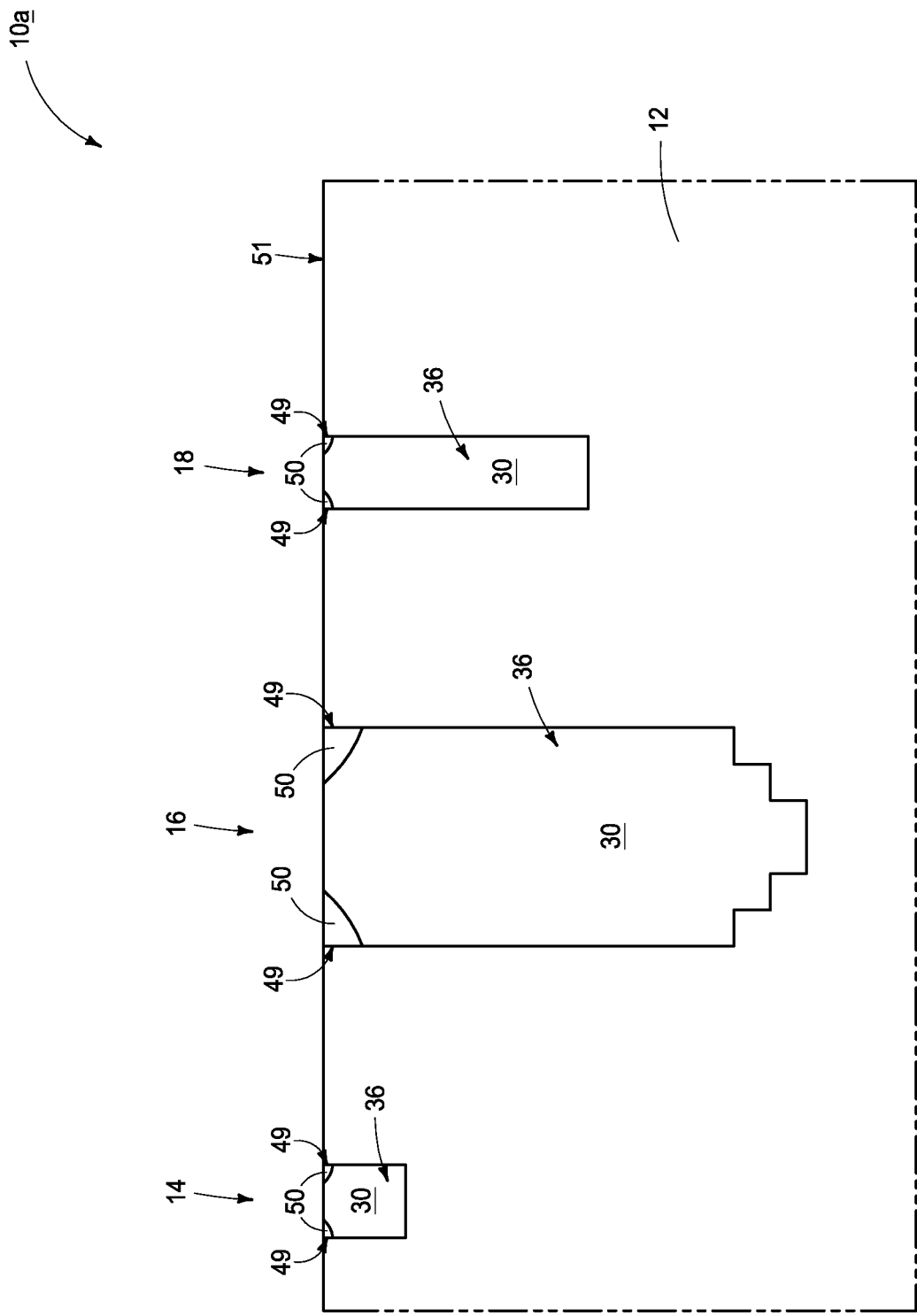
FIG. 9 is a diagrammatic cross-sectional view of the example semiconductor construction of FIGS. 4-8 shown at a processing stage alternative to that of FIG. 8.

In the embodiments of FIGS. 8 and 9, the planarized surface 51 extends across an upper surface of substrate 12, and across upper surfaces of dielectric material 50. In some embodiments, the second dielectric material 50 may be considered to comprise lateral edges 49 which are directly against the semiconductor substrate 12, and the planarized upper surface 51 may be considered to extend across regions of the silicon substrate 12 directly against such lateral edges 49.

The processing of FIGS. 4-9 forms multiple dielectric materials within the openings 14, 16 and 18. The relative amounts of the various dielectric materials, the compositions of the dielectric materials, and the overall number of the dielectric materials may be adjusted to avoid the problematic strain-inducing characteristics associated with prior art processes (described above in the BACKGROUND section) in which openings are filled with large volumes of a single composition of dielectric material. In embodiments in which strain-inducing characteristics are not found to be a problem associated with dielectric material 30 relative to one or more of the openings 14, 16 and 18, it may be desirable to fill such one or more of the openings 14, 16 and 18 with only dielectric material 30.

In the embodiments of FIGS. 4-9, the patternable dielectric material 30 is formed within openings 14, 16 and 18, and directly against the surface of the semiconductor substrate 12 within such openings. Such may be suitable in applications in which it is found that the patternable dielectric material 30 adheres acceptably within the openings 14, 16 and 18 without additional treatment of internal surfaces of such openings. However, in some embodiments it may be desired to form a liner along the internal surfaces of openings 14, 16 and 18 in order to improve adhesion of the patternable dielectric material 30 within such openings. The liner may be useful in applications in which the internal surfaces of one or more of the openings 14, 16 and 18 comprise a composition to which the patternable dielectric material 30 does not adhere suitably well, as well as in applications in which one or more of the openings 14, 16 and 18 has an internal surface comprising heterogeneous bonding characteristics relative to the patternable dielectric material 30. Such heterogeneous bonding characteristics may be due to, for example, such internal surface comprising regions of multiple different compositions, structures or components. The formation of a liner along an internal surface having heterogenous bonding characteristics may be considered to form a coating over such internal surface, with the coating having homogeneous bonding characteristics. In some applications, the liner may additionally, or alternatively, function as a barrier to impede or prevent diffusion of materials form dielectric material 30 into substrate 12; and/or to impede or prevent diffusion of materials from substrate 12 into the dielectric material 30.

Figure 10:
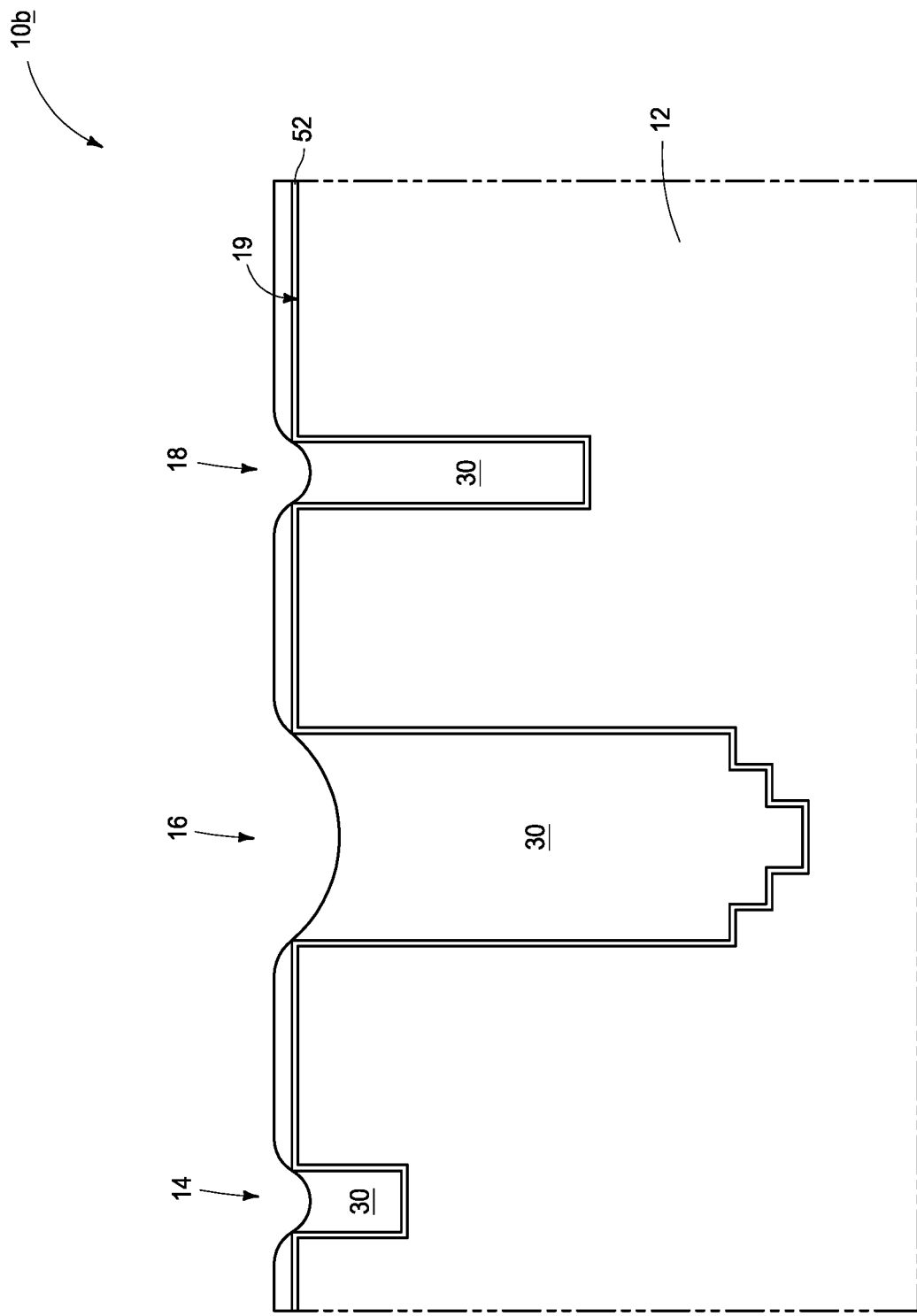
FIGS. 10-14 are diagrammatic cross-sectional views of the example semiconductor construction of FIG. 1 shown at process stages of another example embodiment sequence.

FIG. 10 shows a construction 10b having a liner 52 formed along the internal surfaces of openings 14, 16 and 18. In the shown embodiment, the liner 52 also extends along the upper surface 19 of substrate 12; but in other embodiments may be formed to be only along internal surfaces of one or more of the openings 14, 16 and 18.

The liner 52 may comprise dielectric material, and may be referred to as a dielectric liner. The liner 52 may comprise any suitable composition or combination of compositions; and in some embodiments may comprise one or more of hafnium oxide, zirconium oxide, aluminum oxide, tantalum oxide, silicon dioxide, silicon nitride, etc.

In some embodiments, an opening having the liner 52 therein may be referred to as a lined opening.

The liner 52 may have any suitable thickness; and in some embodiments may have a thickness of from at least about one monolayer to less than or equal to about 50 Å. If the liner is very thin (i.e., approaching a thickness of about one monolayer), the liner may be discontinuous or continuous. In some embodiments, it may be desired for the liner 52 to be continuous so that a homogeneous bonding surface is formed along internal surfaces of the openings.

The photopatternable dielectric material 30 is formed within the lined openings 14, 16 and 18, and in the shown embodiment extends across the substantially planar upper surface 19 of substrate 12.

Figure 11:
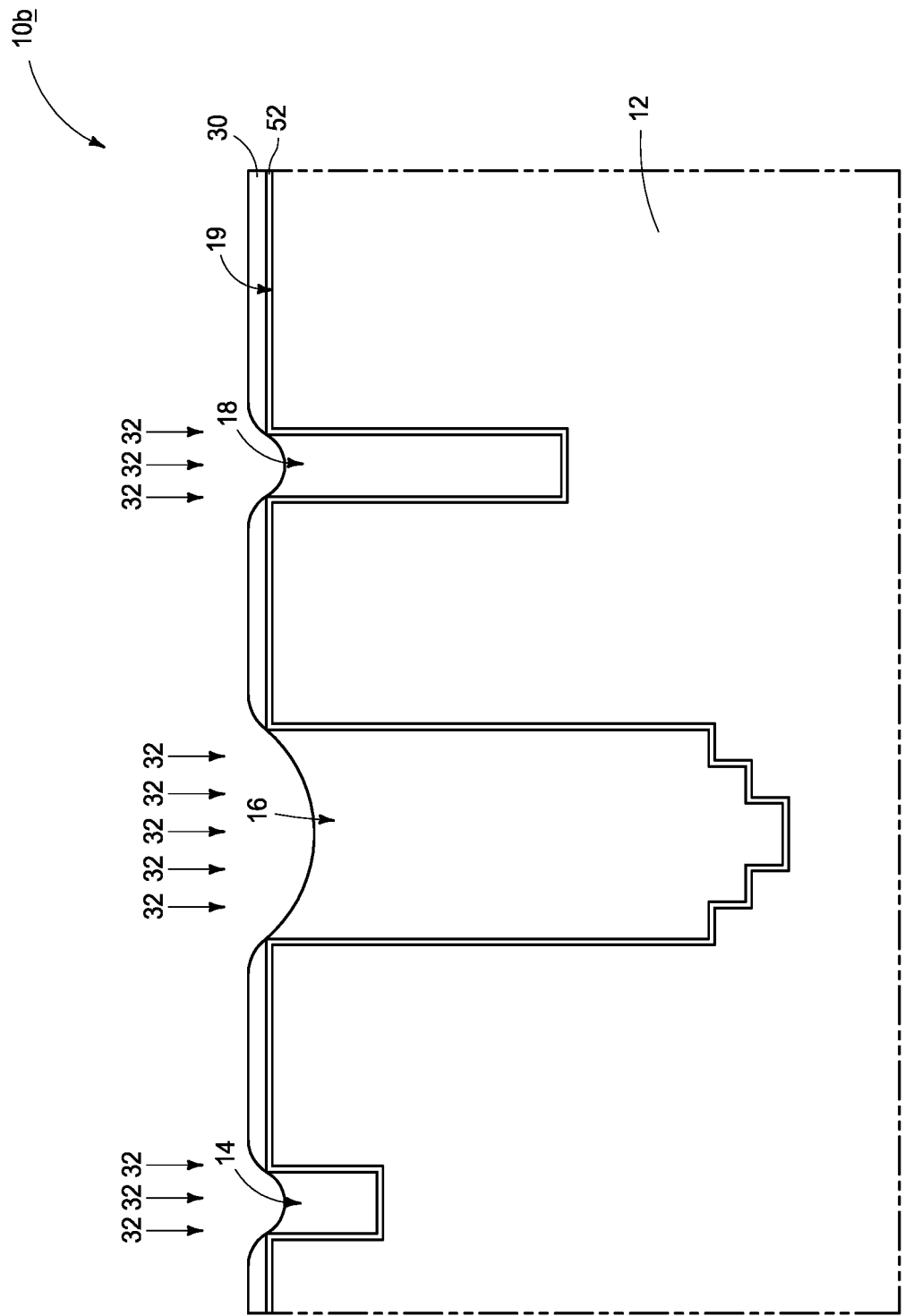

Referring to FIG. 11, the photopatternable dielectric material 30 is exposed to the patterned actinic radiation 32.

Figure 12:
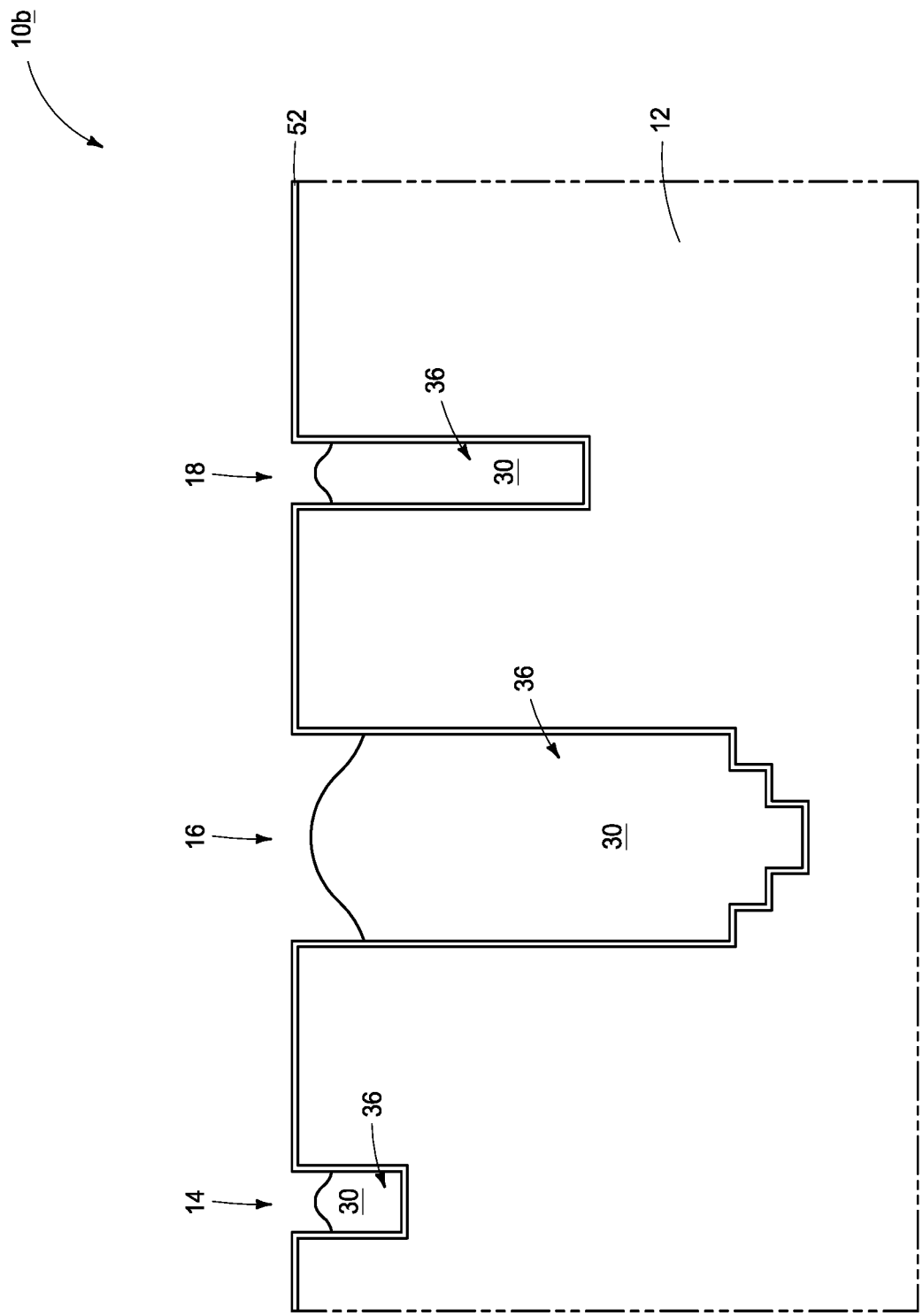

Referring to FIG. 12, the photopatternable dielectric material 30 is developed to remove non-exposed regions of the photopatternable dielectric material 30, and leave the dielectric structures 36 within openings 14, 16 and 18.

Figure 13:
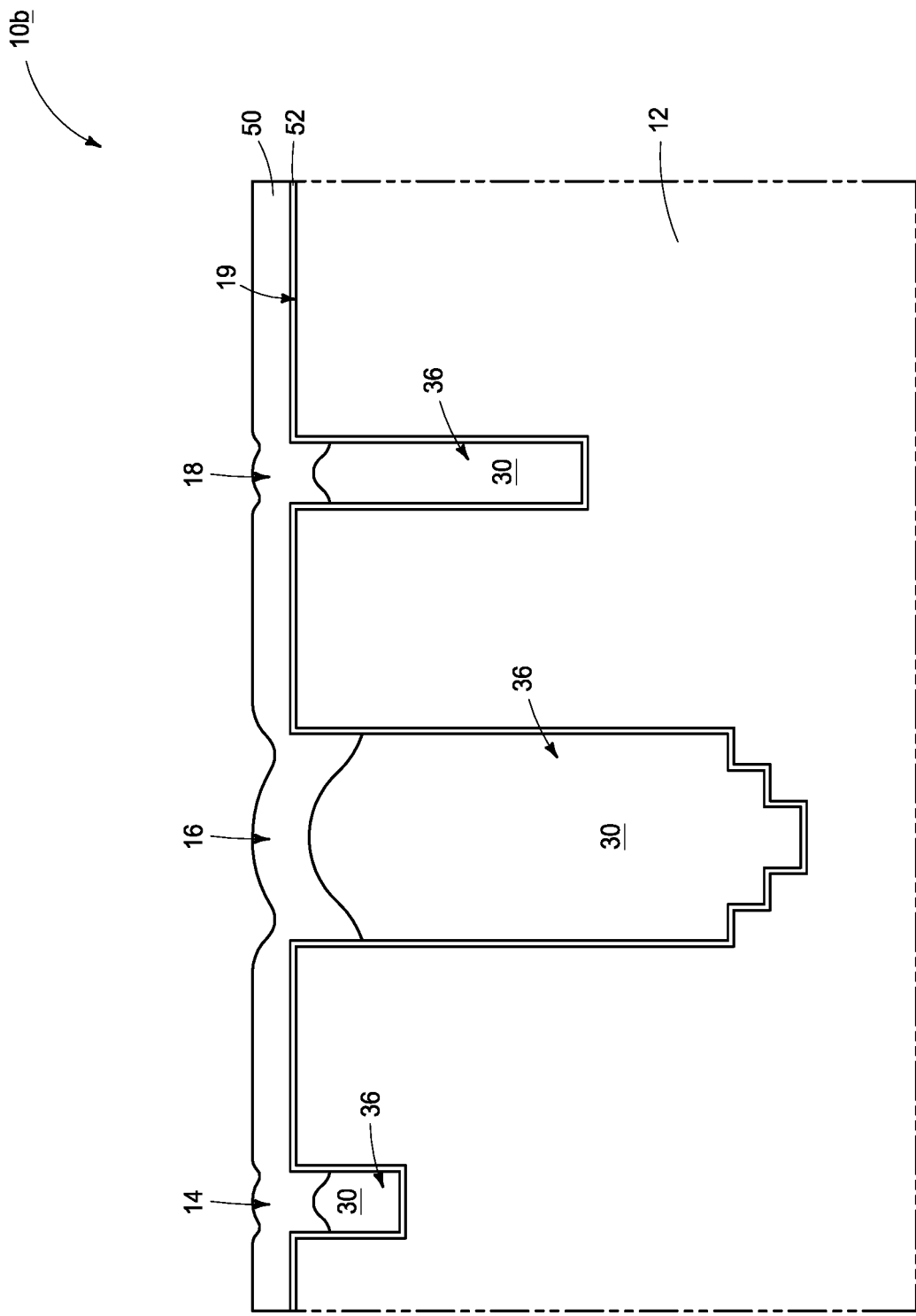

Referring to FIG. 13, the dielectric material 50 is formed across the surface 19 of substrate 12 and within the openings 14, 16 and 18.

Figure 14:
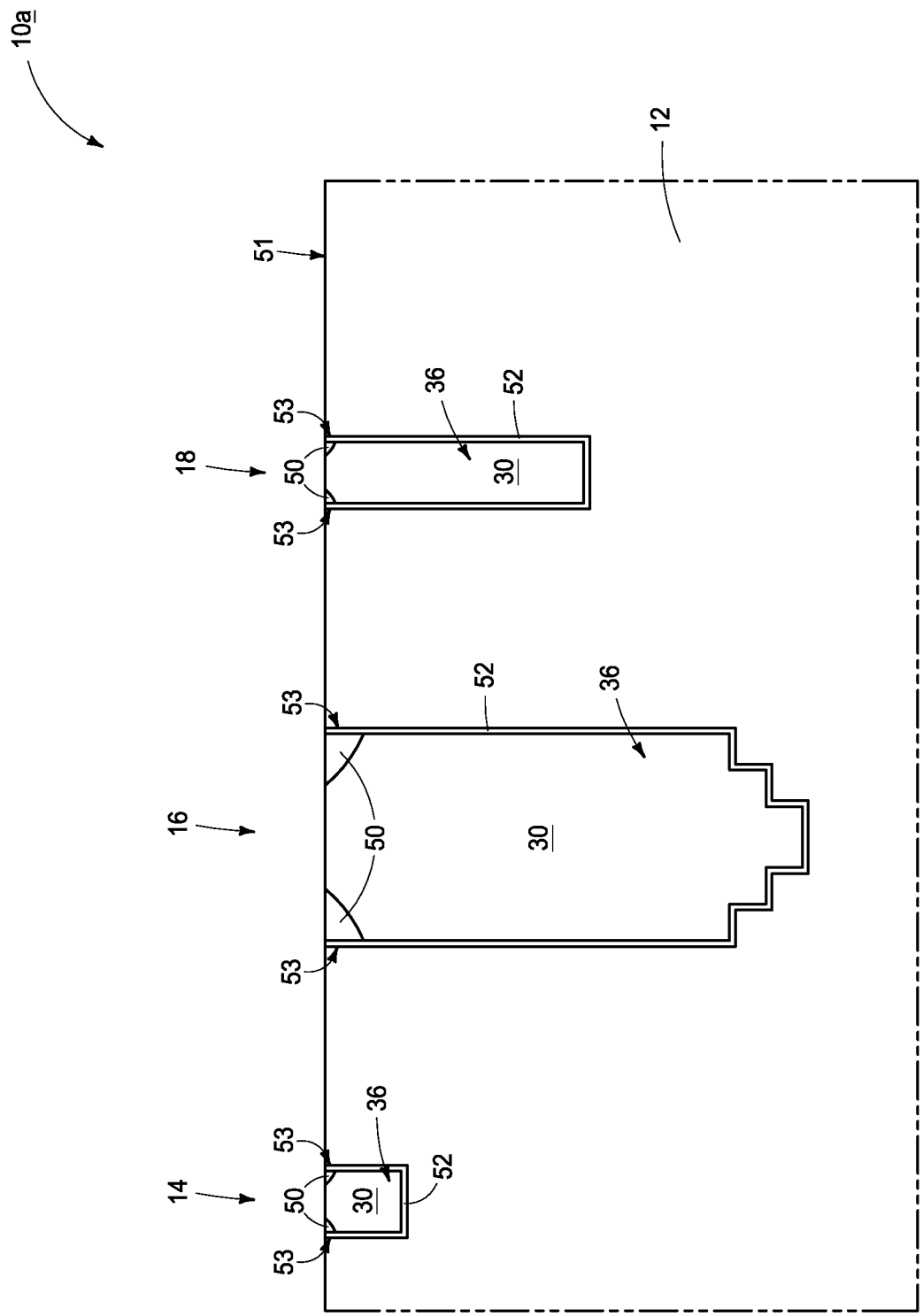

Referring to FIG. 14, CMP or other suitable processing is utilized to form the planarized surface 51 extending across the dielectric materials 30 and 50 within openings 14, 16 and 18, and extending across regions of substrate 12 between the openings 14, 16 and 18. In the shown embodiment, liner material 52 is removed from over the regions of substrate 12 between the openings 14, 16 and 18 during the planarization utilized to form of the planarized surface 51.

In the embodiment of FIG. 14, the planarized surface 51 extends across an upper surface of substrate 12, and across upper surfaces of liner material 52, dielectric material 50, and dielectric structures 36. In some embodiments, the dielectric structures 36 may be considered to comprise first dielectric material 30 having a first composition, the dielectric material 50 may be considered to be a second dielectric material having a second composition, and the dielectric liners 52 and be considered to comprise a third dielectric material having a third composition. The planarized surface 51 may be considered to extend across such first, second and third dielectric materials. The third dielectric material of liners 52 may be considered to comprise lateral edges 53 which are directly against the semiconductor substrate 12, and the planarized upper surface 51 extends across regions of the silicon substrate 12 directly against such lateral edges 53.

Although the dielectric material 50 is indicated to be a second dielectric material, and the liner 52 is indicated to comprise a third dielectric material; in other embodiments, the liner 52 may be considered to comprise the second dielectric material, and the dielectric material 50 may be considered to be the third dielectric material. In such embodiments, the second dielectric material of the liner 52 is under the dielectric structures 36, and the third dielectric material 50 is over such dielectric structures.

In some embodiments, the liner 52 may comprise a same composition as the dielectric material 50, and different from the dielectric material 30. In some embodiments, the liner 52 may comprise a composition different from the dielectric material 50, and different from the dielectric material 30.

Figure 15:
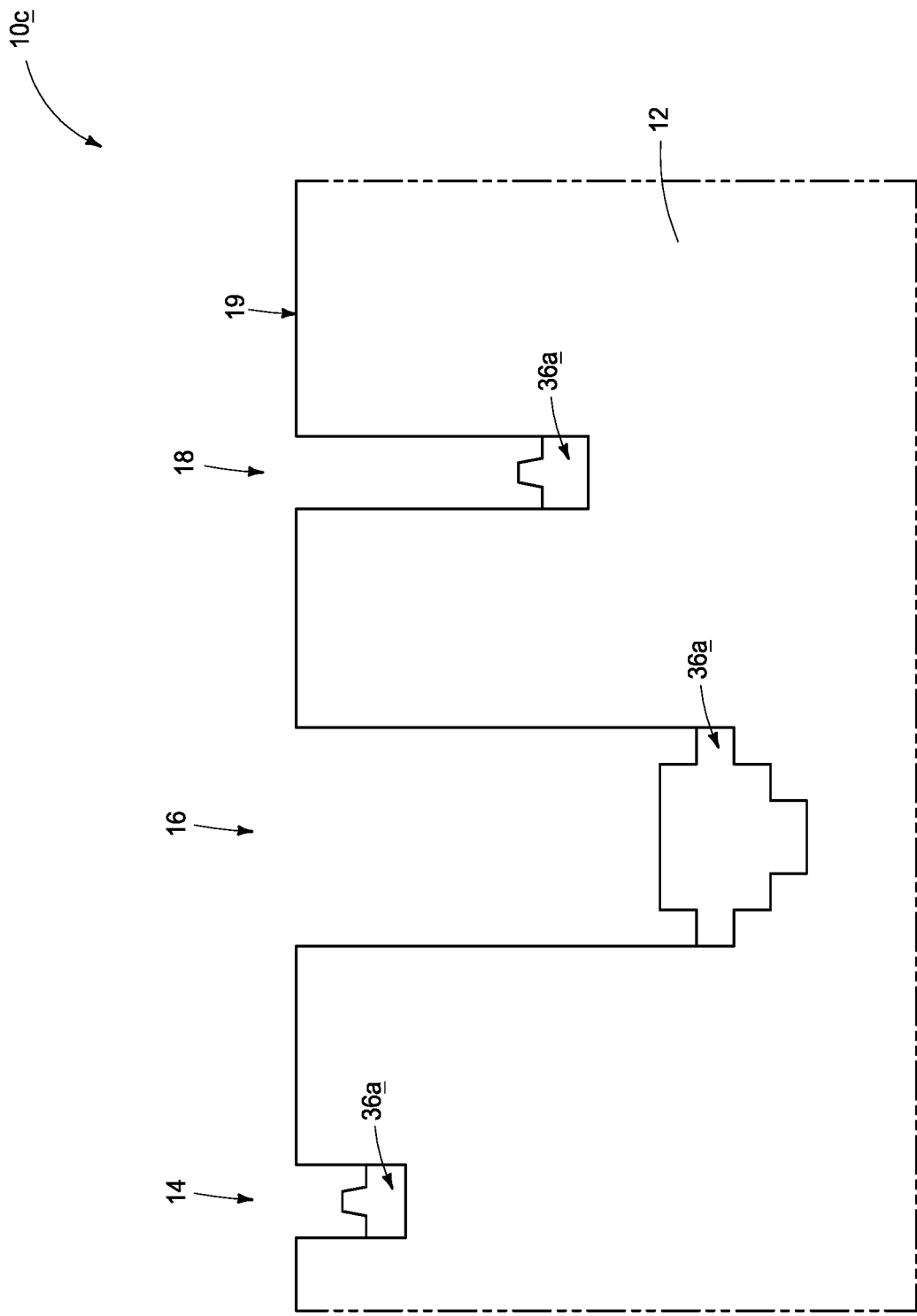
FIGS. 15-18 are diagrammatic cross-sectional views of the example semiconductor construction of FIG. 1 shown at process stages of another example embodiment sequence.

In the embodiments of FIGS. 1-14, a single dielectric structure 36 is formed within each of the openings 14, 16 and 18 from the photopatternable material 30. In other embodiments, multiple sequences of photo-patterning may be conducted to form two or more photo-patterned structures within at least some of the openings. For instance, FIG. 15 shows a construction 10c at a processing stage analogous to that of FIG. 6, but in which photo-patterned dielectric structures 36a fill relatively small volumes of the openings 14, 16 and 18 (for instance, less than 50 volume percent of at least some of the openings, less than 30 volume % of at least some of the openings, less than 20 volume % of at least some of the openings, etc.). The structures 36a may have any suitable shapes. For instance, in some embodiments, the structures 36a may have smoother upper surfaces than illustrated; as it is desired to avoid corners or any other abrupt features, as such may undesirably propagate cracking.

Figure 16:
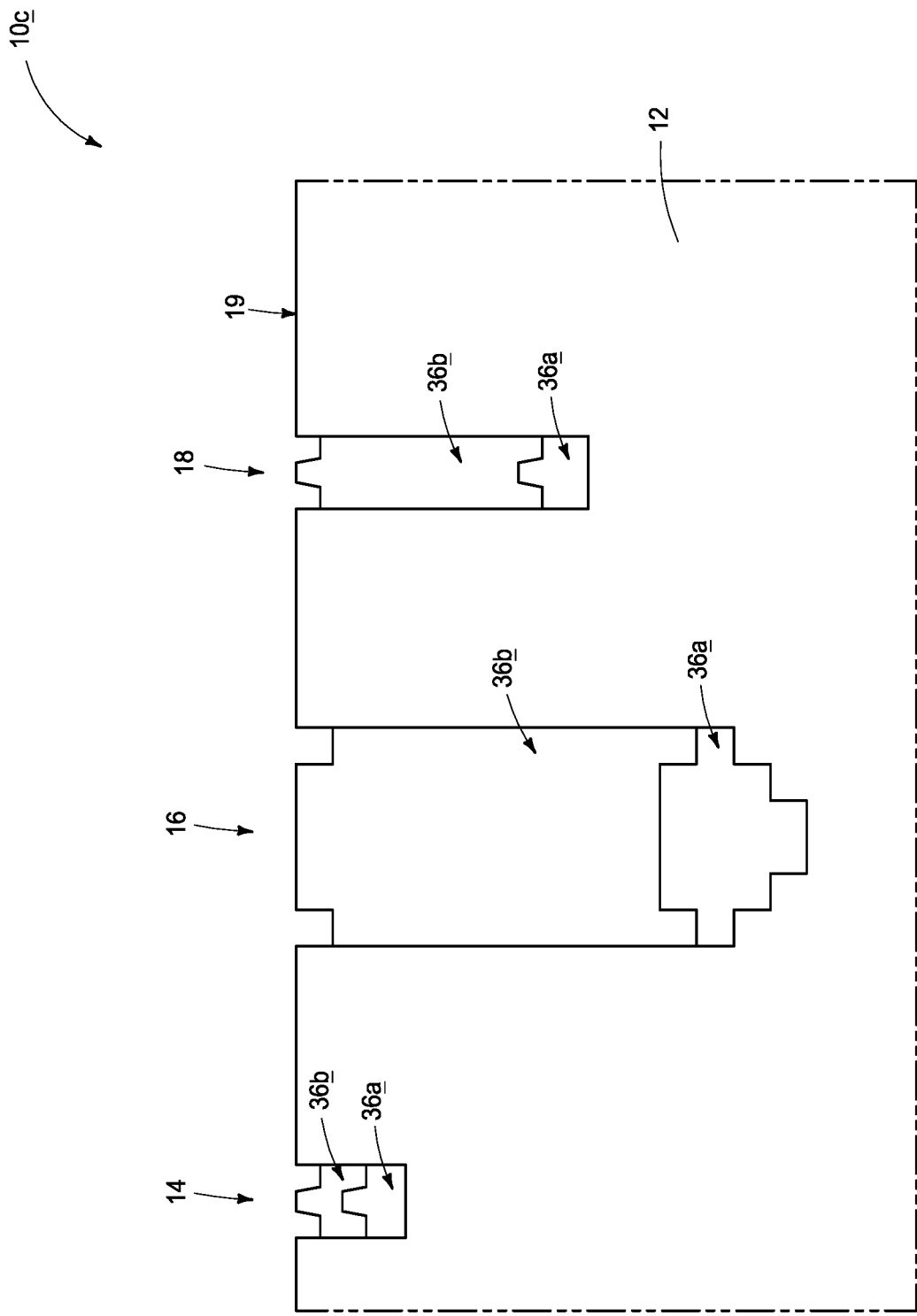

Referring to FIG. 16, additional photo-patterned dielectric structures 36b are formed within the openings 14, 16 and 18 and over the dielectric structures 36a. The dielectric structures 36b may be formed from a same photopatternable dielectric material as the structures 36a in some embodiments, and accordingly may comprise a same composition as the dielectric structures 36a. In other embodiments, the dielectric structures 36b may be formed from different photopatternable dielectric material than the structures 36a, and may therefore comprise a different composition than the structures 36a. The structures 36b may be conformal over the structures 36a and thus have uniform thicknesses across upper surfaces of structures 36b (as shown); or may be non-conformal over the structures 36a in other embodiments.

Figure 17:
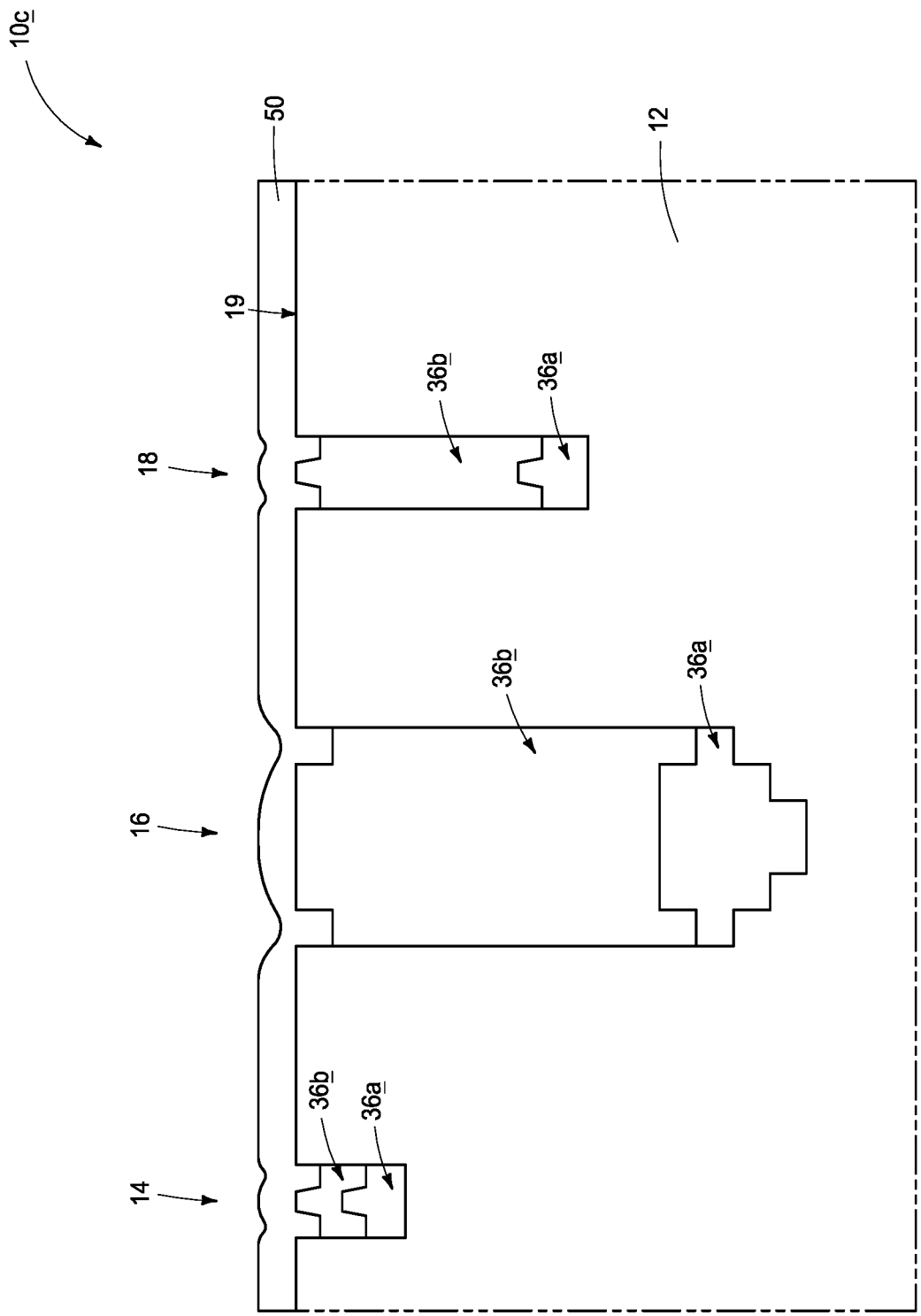

Referring to FIG. 17, the dielectric material 50 is formed across semiconductor substrate 12, and within upper regions of openings 14, 16 and 18.

Figure 18:
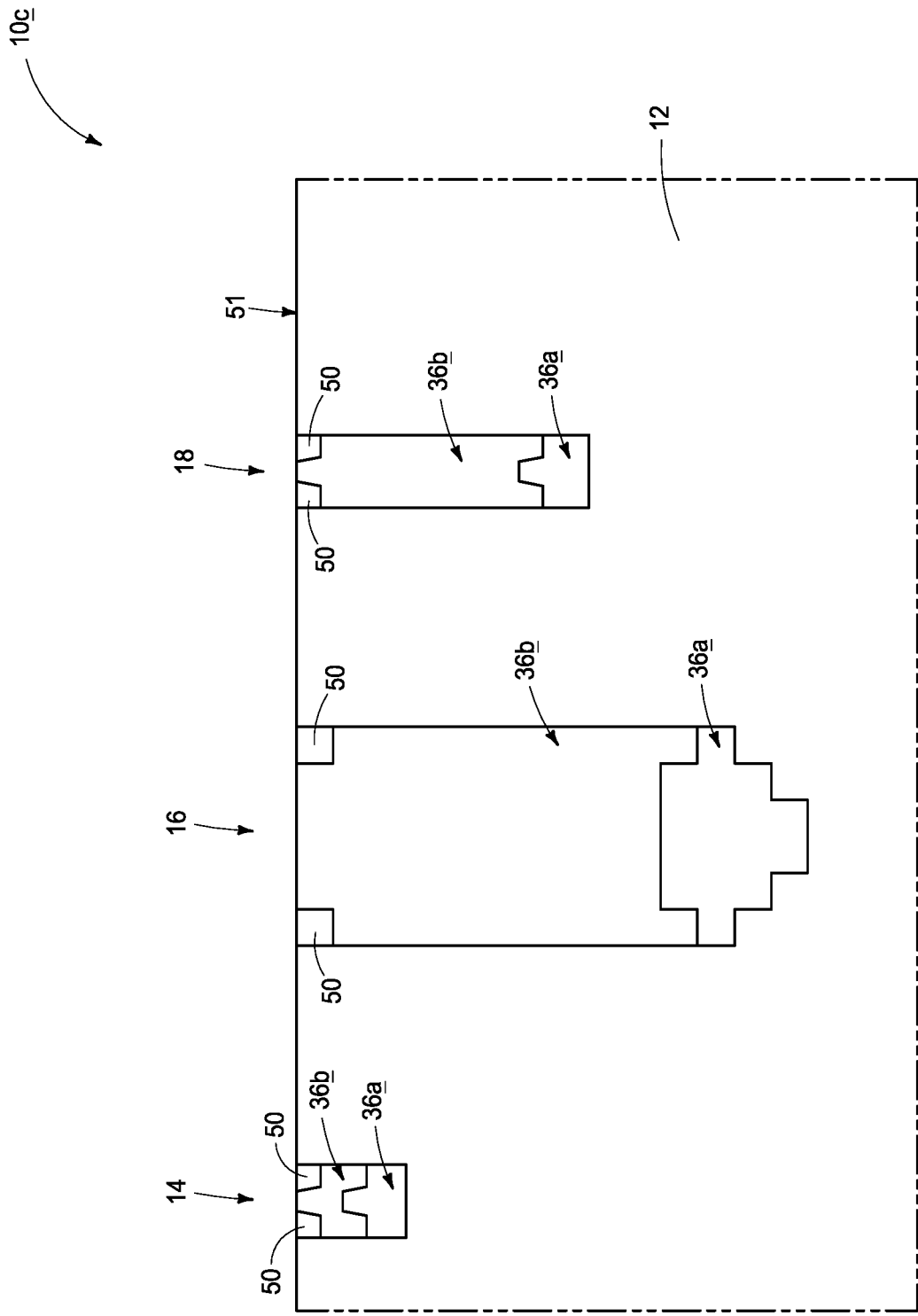

Referring to FIG. 18, construction 10c is subjected to CMP or other appropriate processing to form the planarized surface 51 extending across semiconductor substrate 12, and across the dielectric materials within openings 14, 16 and 18.

Figure 19:
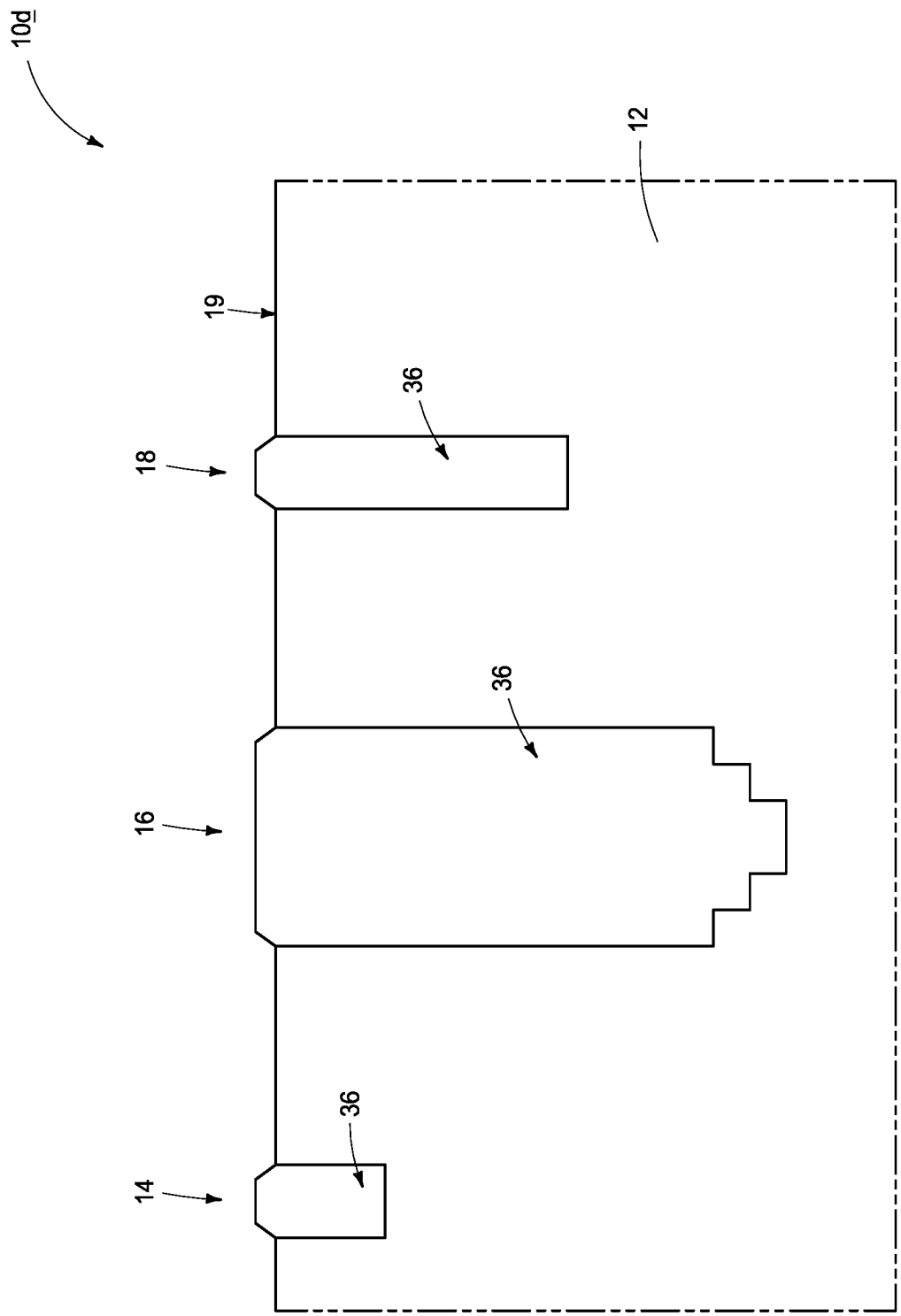
FIG. 19 is a diagrammatic cross-sectional view of the example semiconductor construction of FIG. 1 shown at a process stage of another example embodiment.

The embodiments described above form the dielectric structures (e.g., 36, 36a, 36b) to only partially fill the openings 14, 16 and 18. In other embodiments, the dielectric structures (e.g., 36, 36a, 36b) may entirely fill one or more of the openings. For instance, FIG. 19 shows a construction 10d at a processing stage analogous to that of FIG. 6 in an embodiment in which the dielectric structures 36 entirely fill all of the openings 14, 16 and 18. In the embodiment of FIG. 19, the dielectric structures have overfilled the openings to a minor extent. The overfill may be non-problematic for subsequent processing, and accordingly may remain in a semiconductor package formed from the construction of 10d. Alternatively, the construction may be subjected to CMP or other suitable processing to form a planarized upper surface 51 extending across the substrate 12 and the dielectric structures 36, as shown in FIG. 20.

Figure 20:
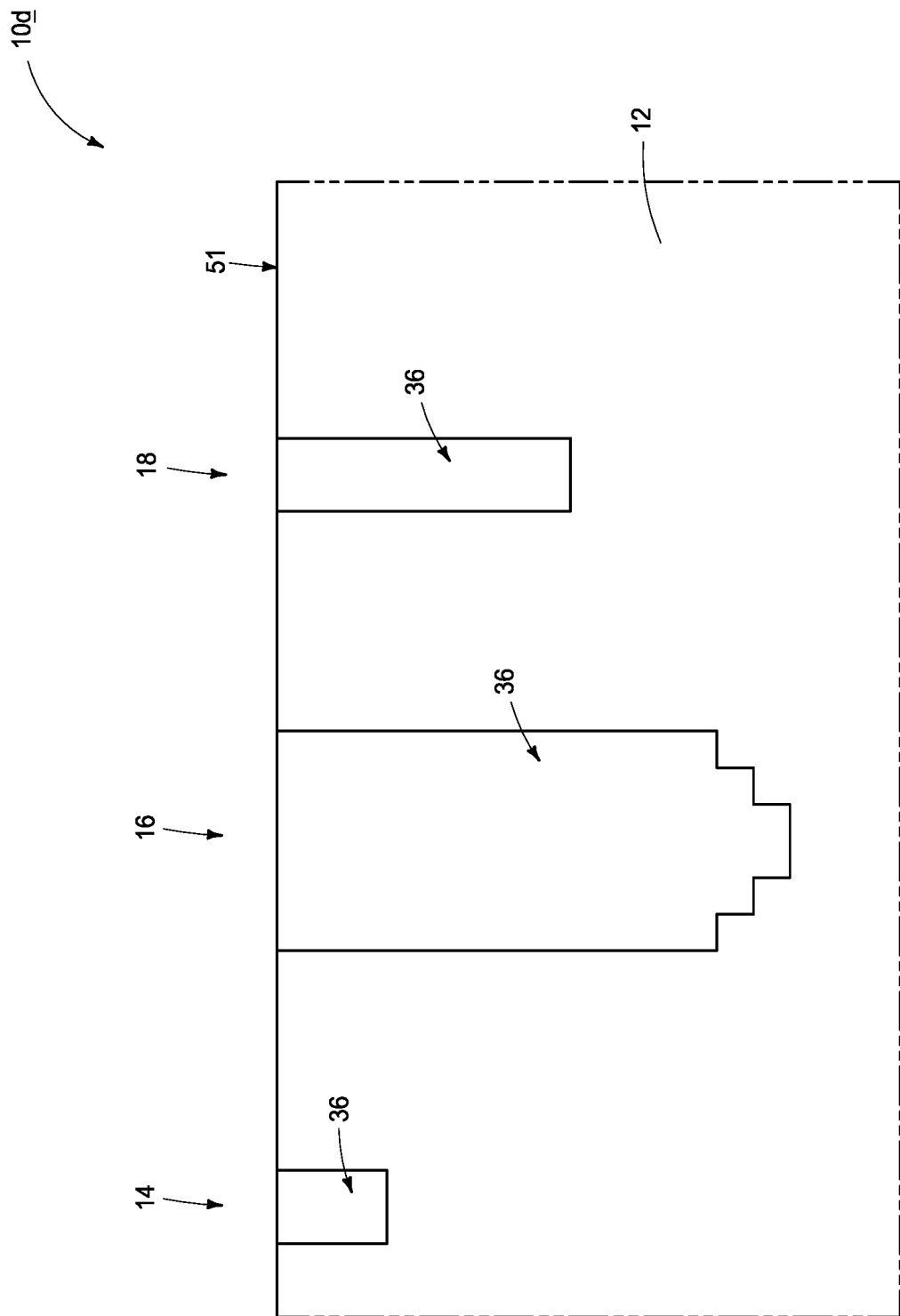
FIG. 20 is a diagrammatic cross-sectional view of the example semiconductor construction of FIG. 1 shown at a process stage that may follow that of FIG. 19.
Figure 21:
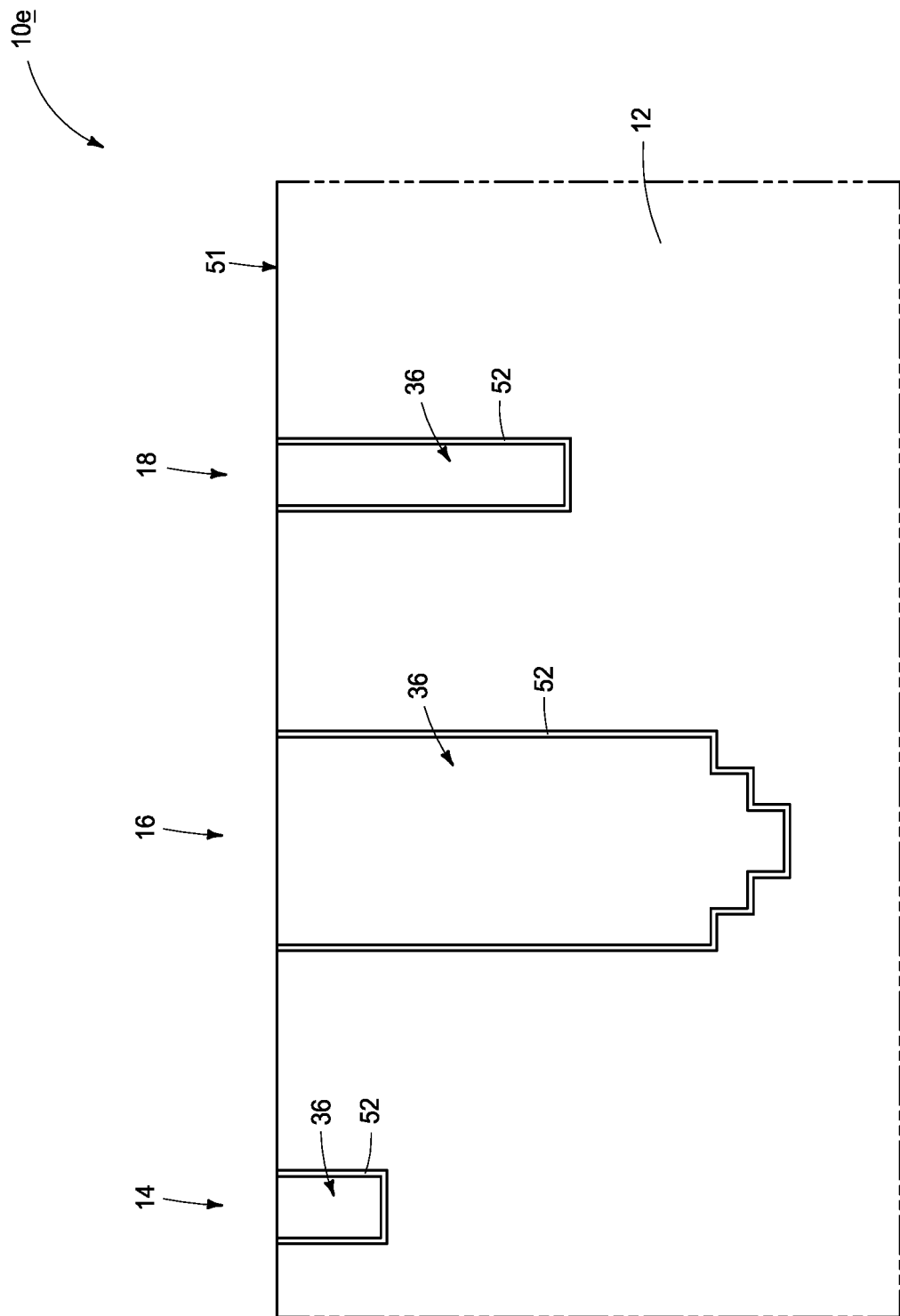
FIG. 21 is a diagrammatic cross-sectional view of the example semiconductor construction of FIG. 1 shown at a process stage of another example embodiment.

The embodiment of FIGS. 19 and 20 shows the dielectric structures 36 formed directly against internal surfaces of substrate 12 within openings 14, 16 and 18. In other processing, liners 52 may be formed along the internal surfaces of openings 14, 16 and 18 prior to forming the dielectric structures 36. The liners may be formed and utilized with processing analogous that described above with reference to FIGS. 10-12. For instance, FIG. 21 shows a construction 10e similar to the construction 10d of FIG. 20, but comprising liners 52 along internal surfaces of the openings 14, 16 and 18.

The methodology described above with reference to FIGS. 4-21 may reduce the problematic overburden described with reference to the prior art in the BACKGROUND section. Also, utilization of multiple dielectric materials to fill the various openings in some embodiments may alleviate or prevent the problematic cracking issues described above with reference to the prior art in the BACKGROUND section if problematic strain-inducing characteristics are associated with one or more of the dielectric materials.

The dielectric structures described above may be utilized relative to semiconductor substrates comprising sensors, MEMS, memory circuitry (i.e., NAND, DRAM, etc.), etc.; and may be incorporated into any of numerous packaged products, including multi-chip packaging, Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include a method of providing dielectric fill across a semiconductor substrate having an opening extending therein. The semiconductor substrate has an upper surface proximate the opening. The method includes forming photopatternable dielectric material within the opening and across the upper surface, and exposing the photopatternable dielectric material to patterned actinic radiation. Subsequently, the photopatternable dielectric material is developed to pattern the photopatternable dielectric material into a first dielectric structure which only partially fills the opening, and to remove the photopatternable dielectric material from over the upper surface. One or more additional dielectric structures are formed over the first dielectric structure to substantially entirely fill the opening.

Some embodiments include a method of providing dielectric fill across a semiconductor substrate. The semiconductor substrate has a substantially planar upper surface. Openings extend through such upper surface and into the semiconductor substrate. The method includes lining the openings with a first dielectric material. The first dielectric material has a thickness of less than or equal to about 50 Å. Photopatternable dielectric material is formed within the lined openings and across the substantially planar upper surface. The photopatternable dielectric material is exposed to patterned actinic radiation and subsequently developed to pattern the photopatternable dielectric material into first dielectric structures within the lined openings, and to remove the photopatternable dielectric material from over the substantially planar upper surface.

Some embodiments include a semiconductor construction which has one or more openings extending into a semiconductor substrate. The openings are at least partially filled with dielectric material comprising silicon, oxygen and carbon. The carbon is present to a concentration within a range of from about 3 atomic percent to about 20 atomic percent.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of providing dielectric fill across a semiconductor construction having an opening extending therein, the semiconductor construction having an upper surface proximate the opening, the method comprising:
   forming photopatternable dielectric material within the opening and across the upper surface;
   exposing the photopatternable dielectric material to patterned actinic radiation and subsequently developing the photopatternable dielectric material to pattern the photopatternable dielectric material into a first dielectric structure which only partially fills the opening, and to remove the photopatternable dielectric material from over the upper surface; and
   forming one or more additional dielectric structures over the first dielectric structure to substantially entirely fill the opening.

2. The method of claim 1 wherein the photopatternable dielectric material includes one or more of siloxane, silsesquioxane and diazonaphthoquinone.

3. The method of claim 1 wherein the photopatternable dielectric material is negative tone material.

4. The method of claim 1 wherein the photopatternable dielectric material is positive tone material.

5. The method of claim 1 wherein a composition of the first dielectric structure includes silicon, oxygen and carbon; with the carbon being present to a concentration within a range of from about 3 atomic percent to about 20 atomic percent.

6. The method of claim 5 wherein the composition of the first dielectric structure further includes one or both of hydrogen and nitrogen.

7. The method of claim 1 further comprising treating the first dielectric structure to alter one or more physical characteristics of the first dielectric structure; said treatment including exposure to one or more of ultraviolet light, hydrogen peroxide, water vapor, steam, ammonia, oxygen, ozone, ozonated water, tetramethylammonium hydroxide, nitrogen, argon, and thermal processing to a temperature within a range of from about 250° C. to about 850° C.

8. The method of claim 1 further comprising treating the first dielectric structure to alter one or more physical characteristics of the first dielectric structure; said treatment including thermal processing to a temperature within a range of from about 250° C. to about 850° C.

9. The method of claim 8 wherein said one or more physical characteristics include density, and wherein said treatment increases the density of the first dielectric structure.

10. The method of claim 1 wherein the first dielectric structure fills at least about 80%, by volume, of the opening.

11. The method of claim 1 wherein the first dielectric structure has a peak and sidewalls extending downwardly from said peak; the sidewalls being spaced from peripheral edges of the opening by gaps.

12. The method of claim 11 wherein the upper surface of the semiconductor construction defines a horizontal direction, wherein a vertical direction is defined to be orthogonal to said horizontal direction, and wherein the sidewalls extend along directions which are angled from the vertical direction by at least about 10 degrees.

13. The method of claim 1 further comprising forming a dielectric liner within the opening prior to forming the photopatternable dielectric material within the opening; the dielectric liner comprising one or more of hafnium oxide, zirconium oxide, aluminum oxide, tantalum oxide, silicon dioxide and silicon nitride.

14. A method of providing dielectric fill across a semiconductor construction, the semiconductor construction having a substantially planar upper surface, openings extend through said substantially planar upper surface and into the semiconductor construction, the method comprising:
   lining the openings with a first dielectric material to form lined openings, the first dielectric material within the lined openings having a thickness of less than or equal to about 50 Å;
   forming photopatternable dielectric material within the lined openings and across the substantially planar upper surface; and
   exposing the photopatternable dielectric material to patterned actinic radiation and subsequently developing the photopatternable dielectric material to pattern the photopatternable dielectric material into second dielectric structures within the lined openings, and to remove the photopatternable dielectric material from over the substantially planar upper surface.

15. The method of claim 14 wherein a composition of the second dielectric structures includes silicon, oxygen and carbon; with the carbon being present to a concentration within a range of from about 3 atomic percent to about 20 atomic percent.

16. The method of claim 15 wherein the composition of the second dielectric structures further includes one or both of hydrogen and nitrogen.

17. The method of claim 14 further comprising treating the second dielectric structures to alter one or more physical characteristics of the second dielectric structures; said treatment including exposure to one or more of ultraviolet light, hydrogen peroxide, water vapor, steam, ammonia, oxygen, ozone, ozonated water, tetramethylammonium hydroxide, nitrogen, argon, and thermal processing to a temperature within a range of from about 250° C. to about 850° C.

18. The method of claim 14 wherein the second dielectric structures only partially fill at least some of the openings; and further comprising:
- forming additional dielectric material across the substantially planar upper surface and within the partially-filled openings; and
- utilizing chemical-mechanical polishing to form a planarized surface extending across the additional dielectric material and across regions of the semiconductor construction between the openings.

* * * * *